(12) United States Patent
Okamoto et al.

(10) Patent No.: US 8,174,422 B2
(45) Date of Patent: May 8, 2012

(54) POWER-SUPPLY-NOISE CANCELLING CIRCUIT AND SOLID-STATE IMAGING DEVICE

(75) Inventors: Ryuta Okamoto, Palo Alto, CA (US); Toshikazu Oda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/727,591

(22) Filed: Mar. 19, 2010

(65) Prior Publication Data
US 2010/0259430 A1 Oct. 14, 2010

(30) Foreign Application Priority Data
Apr. 13, 2009 (JP) ................................. 2009-097280

(51) Int. Cl.
*H03M 1/12* (2006.01)
(52) U.S. Cl. ......... 341/155; 341/118; 341/120; 341/131
(58) Field of Classification Search .................. 341/118, 341/120, 131, 155
See application file for complete search history.

(56) References Cited

U.S. PATENT DOCUMENTS

| | | | | |
|---|---|---|---|---|
| 5,844,515 A | * | 12/1998 | Park | 341/144 |
| 6,133,862 A | * | 10/2000 | Dhuse et al. | 341/118 |
| 7,075,474 B2 | * | 7/2006 | Yamagata et al. | 341/169 |
| 7,129,883 B2 | * | 10/2006 | Muramatsu et al. | 341/164 |
| 7,230,558 B2 | * | 6/2007 | Lim | 341/155 |
| 7,265,326 B2 | * | 9/2007 | Stahli | 219/756 |
| 7,345,613 B2 | * | 3/2008 | Higuchi | 341/155 |
| 7,379,011 B2 | * | 5/2008 | Ham et al. | 341/170 |
| 2002/0145550 A1 | * | 10/2002 | Korkala | 341/131 |
| 2005/0243194 A1 | * | 11/2005 | Xu | 348/241 |
| 2006/0001564 A1 | * | 1/2006 | Yamagata et al. | 341/169 |
| 2007/0008206 A1 | * | 1/2007 | Tooyama et al. | 341/155 |
| 2007/0046513 A1 | * | 3/2007 | Ham et al. | 341/118 |
| 2007/0132868 A1 | | 6/2007 | Lee et al. | |
| 2010/0259430 A1 | * | 10/2010 | Okamoto et al. | 341/122 |
| 2010/0271247 A1 | * | 10/2010 | Lee et al. | 341/155 |

FOREIGN PATENT DOCUMENTS

JP 2008-11284 1/2008

OTHER PUBLICATIONS

Office Action issued Oct. 20, 2011, in Chinese Patent Application No. 2010101358735.

* cited by examiner

*Primary Examiner* — Linh Nguyen
(74) *Attorney, Agent, or Firm* — Oblon, Spivak, McClelland, Maier & Neustadt, L.L.P.

(57) ABSTRACT

A reference voltage generation circuit generates a reference voltage and outputs it to an amplifier reference voltage line. A power-supply-noise adding circuit adds power supply noise superimposed on a power supply to the reference voltage generated by the reference voltage generation circuit. A differential amplifier amplifies a difference between a voltage of a vertical signal line and a voltage of an amplifier reference voltage line and outputs the amplified voltage.

14 Claims, 21 Drawing Sheets

FIG.7

NR1<k-1:0>: CAPACITY CONTROL AGAINST POWER SUPPLY

| SETTING OF REGISTER | $C_{k-1}$ | $C_{k-2}$ | $C_{k-3}$ | ... | $C_2$ | $C_1$ | $C_0$ |
|---|---|---|---|---|---|---|---|
| $2^k-1$ | 1 | 1 | 1 | | 1 | 1 | 1 |
| $2^k-2$ | 1 | 1 | 1 | | 1 | 1 | 0 |
| $2^k-3$ | 1 | 1 | 1 | | 1 | 0 | 1 |
| $2^k-4$ | 1 | 1 | 1 | | 1 | 0 | 0 |
| $2^k-5$ | 1 | 1 | 1 | | 0 | 1 | 1 |
| ... | | | | | | | |
| 4 | 0 | 0 | 0 | | 1 | 0 | 0 |
| 3 | 0 | 0 | 0 | | 0 | 1 | 1 |
| 2 | 0 | 0 | 0 | | 0 | 1 | 0 |
| 1 | 0 | 0 | 0 | | 0 | 0 | 1 |
| 0 | 0 | 0 | 0 | | 0 | 0 | 0 |

NR2<k-1:0>: CAPACITY CONTROL AGAINST GND

| SETTING OF REGISTER | $C'_{k-1}$ | $C'_{k-2}$ | $C'_{k-3}$ | ... | $C'_2$ | $C'_1$ | $C'_0$ |
|---|---|---|---|---|---|---|---|
| 0 | 1 | 1 | 1 | | 1 | 1 | 1 |
| 1 | 1 | 1 | 1 | | 1 | 1 | 0 |
| 2 | 1 | 1 | 1 | | 1 | 0 | 1 |
| 3 | 1 | 1 | 1 | | 1 | 0 | 0 |
| 4 | 1 | 1 | 1 | | 0 | 1 | 1 |
| ... | | | | | | | |
| $2^k-5$ | 0 | 0 | 0 | | 1 | 0 | 0 |
| $2^k-4$ | 0 | 0 | 0 | | 0 | 1 | 1 |
| $2^k-3$ | 0 | 0 | 0 | | 0 | 1 | 0 |
| $2^k-2$ | 0 | 0 | 0 | | 0 | 0 | 1 |
| $2^k-1$ | 0 | 0 | 0 | | 0 | 0 | 0 |

POWER-SUPPLY-NOISE CANCELLING CIRCUIT AND SOLID-STATE IMAGING DEVICE

CROSS-REFERENCE TO RELATED APPLICATIONS

This application is based upon and claims the benefit of priority from the prior Japanese Patent Application No. 2009-97280, filed on Apr. 13, 2009; the entire contents of which are incorporated herein by reference.

BACKGROUND OF THE INVENTION

1. Field of the Invention

The present invention relates to a power-supply-noise cancelling circuit and a solid-state imaging device, and more particularly, is suitably applied to a method of removing power supply noise superimposed on a pixel output signal of a CMOS image sensor.

2. Description of the Related Art

In a CMOS image sensor, a signal from each pixel is sent to a sample-hold signal conversion circuit through a vertical signal line, and a signal component of the signal is detected by CDS (Correlated Double Sampling).

Assuming that a reset-level sampling voltage is Vc and a read-level sampling voltage is Vs, the signal component detected by CDS is given by Vc-Vs.

Meanwhile, when power supply noise is superimposed on the signal from each pixel, the signal component detected by CDS is given by the following Equation (1):

$$(Vc+\Delta Vc)-(Vs+\Delta Vs)=(Vc-Vs)+(\Delta Vc-\Delta Vs) \quad (1)$$

where $\Delta Vc$ is power supply noise at the time of sampling of the reset level and $\Delta Vs$ is power supply noise at the time of sampling of the read level.

In this case, when the power supply noise $\Delta Vc$ and the power supply noise $\Delta Vs$ are equal to each other, the power supply noise $\Delta Vc$ and the power supply noise $\Delta Vs$ cancel out each other and degradation of image quality because of the power supply noise $\Delta Vc$ and the power supply noise $\Delta Vs$ does not occur. However, because the power supply noise $\Delta Vc$ and the power supply noise $\Delta Vs$ are generated randomly, values of the power supply noise $\Delta Vc$ and the power supply noise $\Delta Vs$ are generally different from each other.

A method of reducing noise is disclosed in, for example, Japanese Patent Application Laid-open No. 2008-11284, in which an averaging process is performed on a plurality of digital code values obtained by repeating AD conversion multiple times on a difference between potentials at the time of reset of an imaging device and after exposure of the imaging device.

However, in the method disclosed in Japanese Patent Application Laid-open No. 2008-11284, because the averaging process is performed on the difference between the potentials at the time of reset of the imaging device and after the exposure of the imaging device to reduce the noise, an actual signal component at the time of sampling of the read level may not be extracted and resolution may be degraded accordingly. Furthermore, because a signal from an identical pixel needs to be sampled multiple times, processing time may be increased.

BRIEF SUMMARY OF THE INVENTION

A power-supply-noise cancelling circuit according to an embodiment of the present invention comprises: a reference-voltage generation circuit that generates a reference voltage; a power-supply-noise adding circuit that adds power supply noise superimposed on a power supply to the reference voltage; and a differential amplifier that amplifies a difference between a read signal read out from each pixel of an imaging element and a reference voltage to which power supply noise at the time of reading the read signal is added.

A power-supply-noise cancelling circuit according to an embodiment of the present invention comprises: a reference-voltage generation circuit that generates a reference voltage; a power-supply-noise adding circuit that adds power supply noise superimposed on a power supply to the reference voltage; a capacitor that stores therein a difference between a first sampling signal, which is read out from each pixel of an imaging element and sampled at a first sampling time, and a reference voltage to which power supply noise at the time of the first sampling is added; and a differential amplifier that amplifies a difference between a value obtained by subtracting a signal stored in the capacitor from a second sampling signal, the second sampling signal being read out from each pixel of the imaging device and sampled at a second sampling time, and a reference voltage to which power supply noise at the second sampling time is added.

A power-supply-noise cancelling circuit according to an embodiment of the present invention comprises: a ramp-wave generation circuit that generates a ramp-wave signal; a power-supply-noise adding circuit that adds power supply noise superimposed on a power supply to the ramp-wave signal; and a differential amplifier that amplifies a difference between a read signal read out from each pixel of an imaging element and a ramp-wave signal to which the power supply noise is added.

A solid-state imaging device according to an embodiment of the present invention comprises: a pixel array in which pixels are arrayed in a matrix form; a vertical signal line for transferring a signal read out from the pixels in a vertical direction; a power line for supplying a power supply to the pixels; a reference voltage generation circuit that generates a reference voltage and outputs the reference voltage to an amplifier reference voltage line; a power-supply-noise adding circuit that outputs power supply noise superimposed on the power supply to the amplifier reference voltage line; and a differential amplifier that amplifies a difference between a read signal read out from each pixel of the pixel array and a reference voltage to which power supply noise at the time of reading the read signal is added.

BRIEF DESCRIPTION OF THE DRAWINGS

FIG. 7 is a diagram illustrating a method of controlling capacitance of a variable capacitor by a register;

DETAILED DESCRIPTION OF THE INVENTION

Exemplary embodiments of a power-supply-noise cancelling circuit according to the present invention will be explained below with reference to the accompanying drawings. In the following explanation, the power-supply-noise cancelling circuit applied to a CMOS image sensor will be described as an example. However, the present invention is not limited by the following embodiments.

First Embodiment

Figure 1:
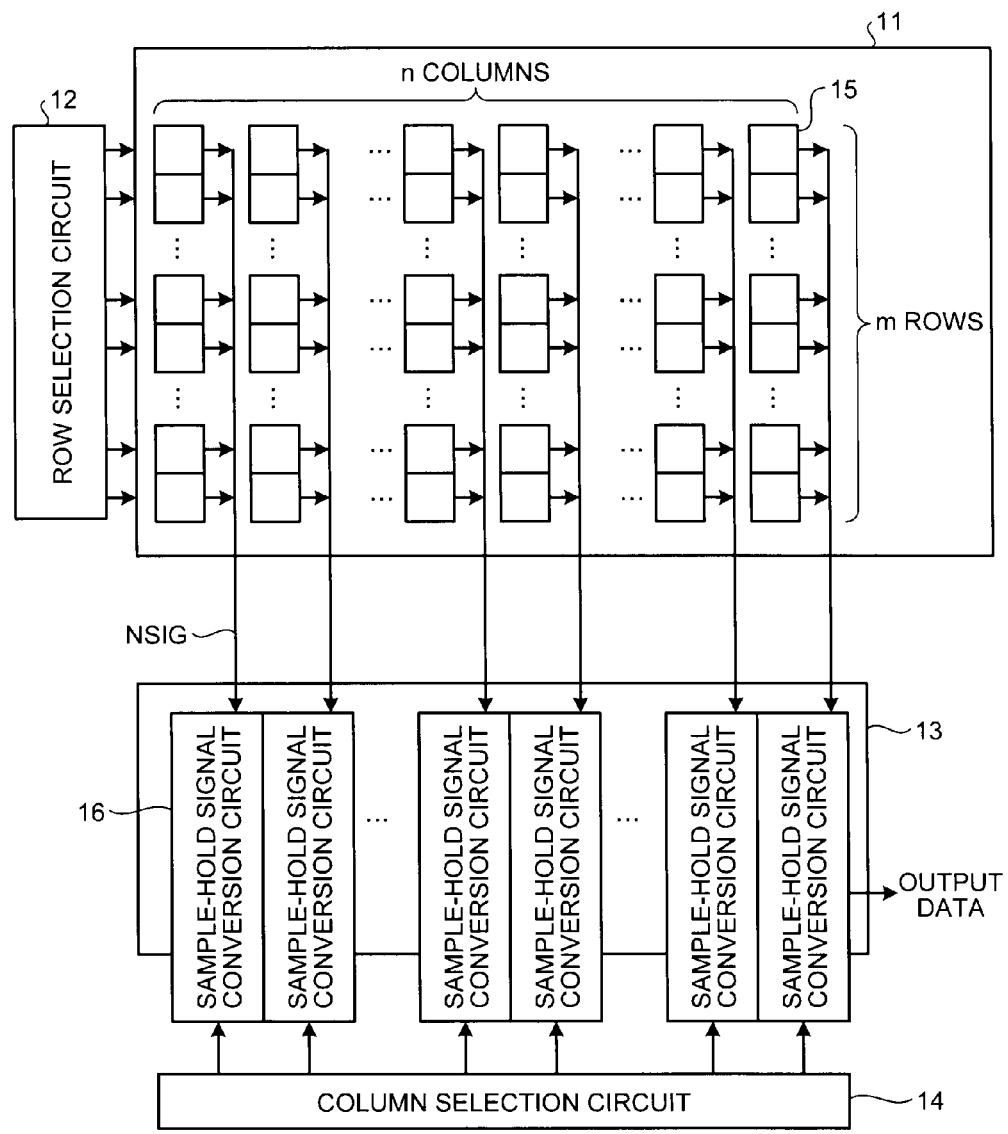
FIG. 1 is a block diagram of a general configuration of a CMOS image sensor to which a power-supply-noise cancelling circuit according to a first embodiment of the present invention is applied.

FIG. 1 is a block diagram of a general configuration of a CMOS image sensor to which a power-supply-noise cancelling circuit according to a first embodiment of the present invention is applied.

In FIG. 1, the CMOS image sensor includes a pixel array 11, a row selection circuit 12, a sample-hold signal conversion circuit group 13, and a column selection circuit 14. In the pixel array 11, pixels 15 that perform photoelectric conversion are arrayed in a matrix of m rows and n columns (m and n are integers equal to or larger than 1). The row selection circuit 12 is able to select a row in which the pixel 15 as a read target is arrayed. The column selection circuit 14 is able to select a column in which the pixel 15 as the read target is arrayed. In the sample-hold signal conversion circuit group 13, sample-hold signal conversion circuits 16 are arranged for respective columns of the array of the pixels 15. The sample-hold signal conversion circuits 16 are connected to each pixel 15 via respective vertical signal lines NSIG per column. The sample-hold signal conversion circuits 16 are able to detect a signal component by CDS when a signal is read out from each pixel 15.

Figure 2:
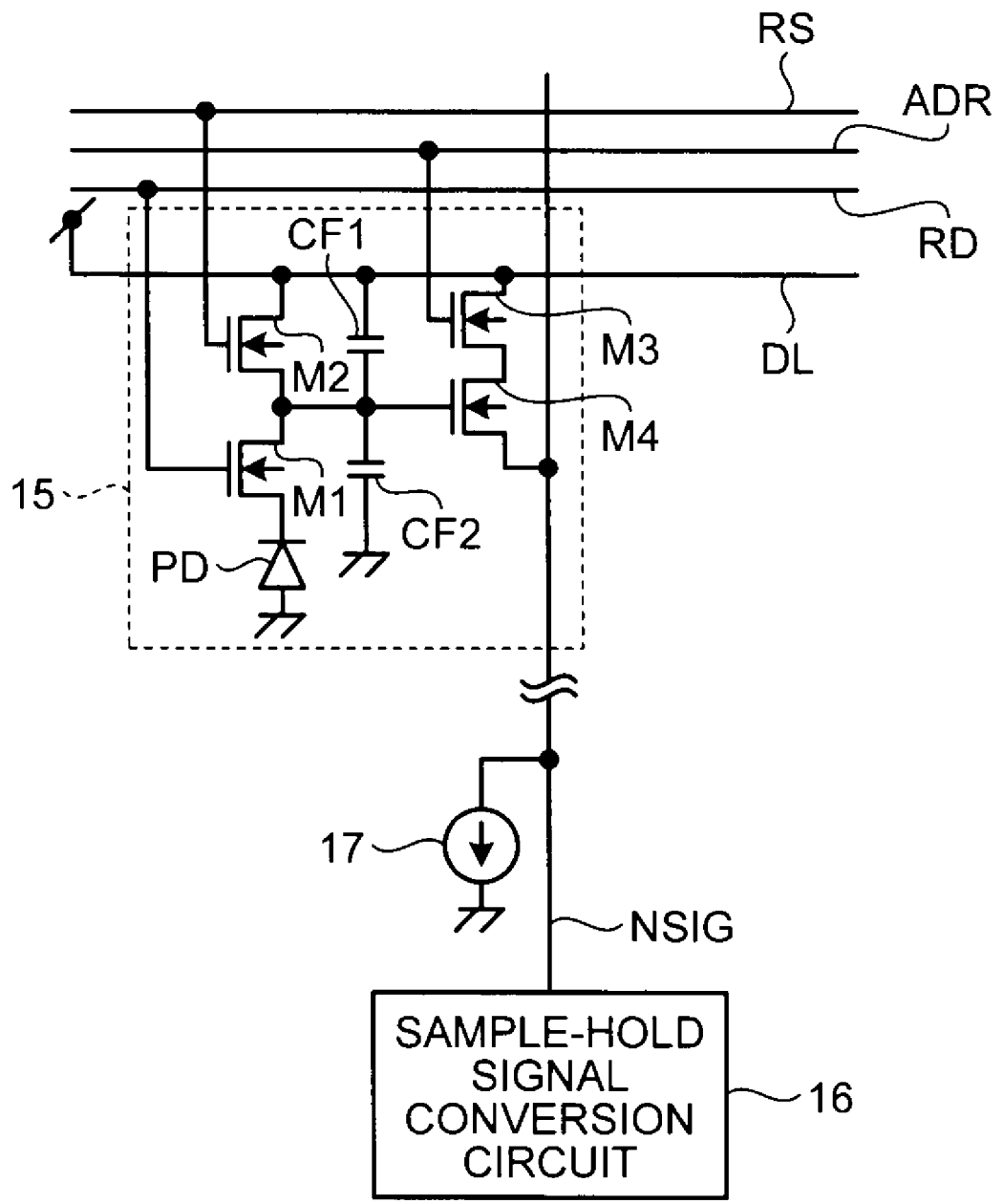
FIG. 2 is a diagram illustrating an example of a circuit configuration of a pixel illustrated in FIG. 1.

FIG. 2 is a diagram illustrating an example of a circuit configuration of the pixel illustrated in FIG. 1.

In FIG. 2, each pixel 15 illustrated in FIG. 1 includes a photodiode PD, a read transistor M1, a reset transistor M2, a row selection transistor M3, and a transfer transistor M4.

A source of the read transistor M1 is connected to the photodiode PD, and a gate of the read transistor M1 is connected to a read signal line RD. A source of the reset transistor M2 is connected to a drain of the read transistor M1, a gate of the reset transistor M2 is connected to a reset signal line RS, and a drain of the reset transistor M2 is connected to a power line DL. A gate of the row selection transistor M3 is connected to a row selection line ADR, and a drain of the row selection transistor M3 is connected to the power line DL. A source of the transfer transistor M4 is connected to a current source 17 and the sample-hold signal conversion circuit 16 via the vertical signal line NSIG, a gate of the transfer transistor M4 is connected to the drain of the read transistor M1, and a drain of the transfer transistor M4 is connected to a source of the row selection transistor M3.

In this case, parasitic capacitance CF1 is present between the gate of the transfer transistor M4 and the power line DL, and parasitic capacitance CF2 is present between the gate of the transfer transistor M4 and the ground.

Figure 3:
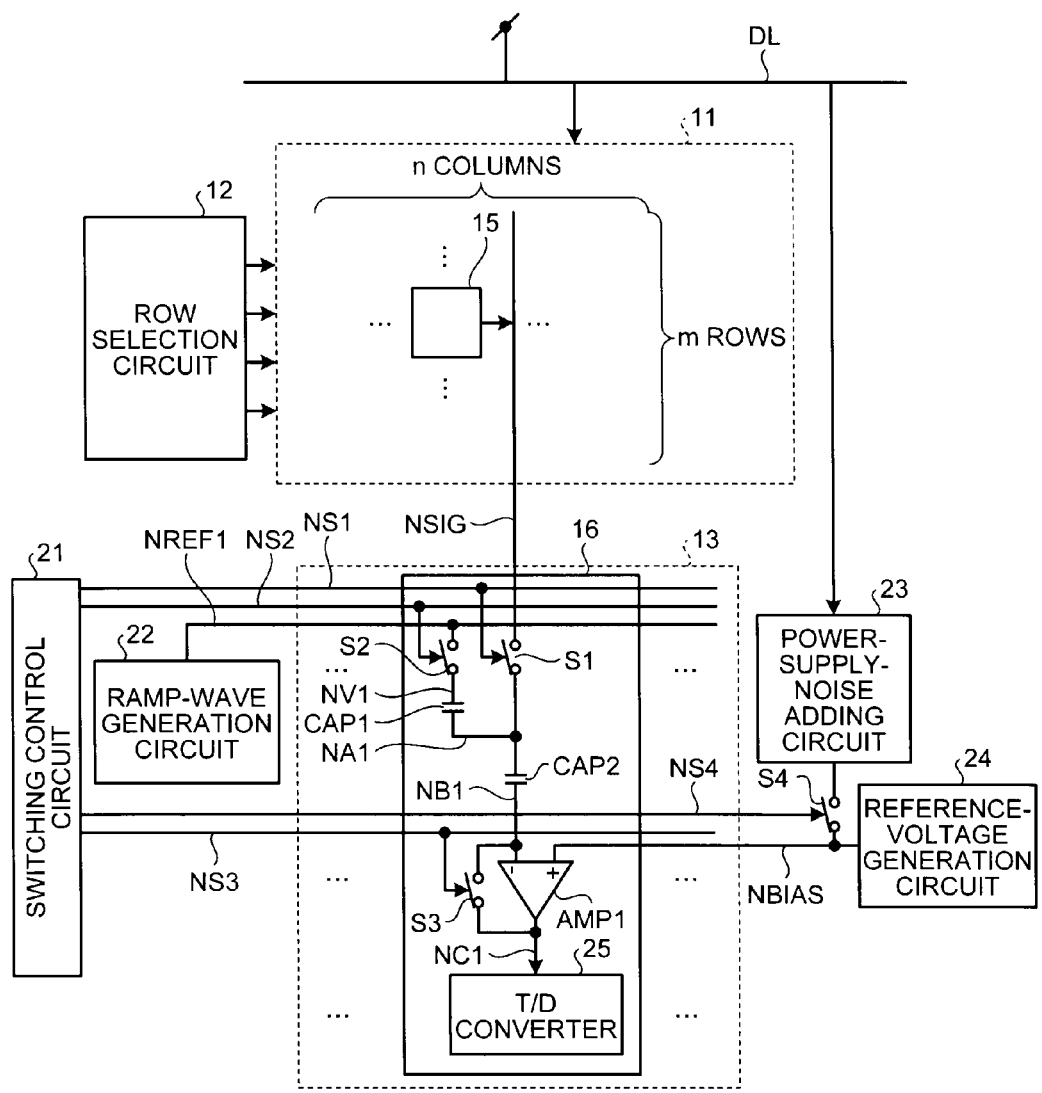
FIG. 3 is a block diagram of a general configuration of the power-supply-noise cancelling circuit applied to a sample-hold signal conversion circuit illustrated in FIG. 1.

FIG. 3 is a block diagram of a general configuration of the power-supply-noise cancelling circuit applied to the sample-hold signal conversion circuit illustrated in FIG. 1.

In FIG. 3, the power-supply-noise cancelling circuit includes the sample-hold signal conversion circuit 16, a switching control circuit 21, a ramp-wave generation circuit 22, a power-supply-noise adding circuit 23, and a reference-voltage generation circuit 24. The switching control circuit 21, the ramp-wave generation circuit 22, the power-supply-noise adding circuit 23, and the reference-voltage generation circuit 24 can be shared by all the sample-hold signal conversion circuits 16 included in the sample-hold signal conversion circuit group 13.

The sample-hold signal conversion circuit 16 includes switches S1 to S3, capacitors CAP1 and CAP2, a differential amplifier AMP1, and a T/D converter 25. The T/D converter 25 is able to convert a count value in a predetermined period of time to a digital value. One end of the capacitor CAP1 is connected to a ramp-wave signal line NREF1 via the switch S2. One end of the capacitor CAP2 is connected to the other end of the capacitor CAP1 and a read control line NS1 via the switch S1. The other end of the capacitor CAP2 is connected to an inverting input terminal of the differential amplifier AMP1. A non-inverting input terminal of the differential amplifier AMP1 is connected to an amplifier reference voltage line NBIAS, and an output terminal of the differential amplifier AMP1 is connected to the inverting input terminal of the differential amplifier AMP1 via the switch S3. An input terminal of the T/D converter 25 is connected to the output terminal of the differential amplifier AMP1.

The ramp-wave generation circuit 22 is able to generate a ramp-wave signal and output it to the ramp-wave signal line NREF1. The reference-voltage generation circuit 24 is able to generate a reference voltage and output it to the amplifier reference voltage line NBIAS. The power-supply-noise adding circuit 23 is able to add power supply noise superimposed on a power supply to the reference voltage generated by the reference-voltage generation circuit 24. An output terminal of the power-supply-noise adding circuit 23 is connected to the amplifier reference voltage line NBIAS via a switch S4. A variable capacitance element connected to the power supply for example may be used as the power-supply-noise adding circuit 23A, and a value of the variable capacitance element may be adjusted to values of the parasitic capacitances CF1 and CF2 illustrated in FIG. 2. Alternatively, a constant capacitance element may be used instead of the variable capacitance element. When the constant capacitance element is used as the power-supply-noise adding circuit 23, a value of the constant capacitance element may be adjusted to the values of the parasitic capacitances CF1 and CF2 illustrated in FIG. 2 by using a trimming method or the like.

The switching control circuit 21 is able to control ON/OFF of the switch S1 via the read control line NS1, ON/OFF of the switch S2 via a ramp-wave control line NS2, ON/OFF of the switch S3 via a reset control line NS3, and ON/OFF of the switch S4 via a power-supply-noise control line NS4.

Figure 4:
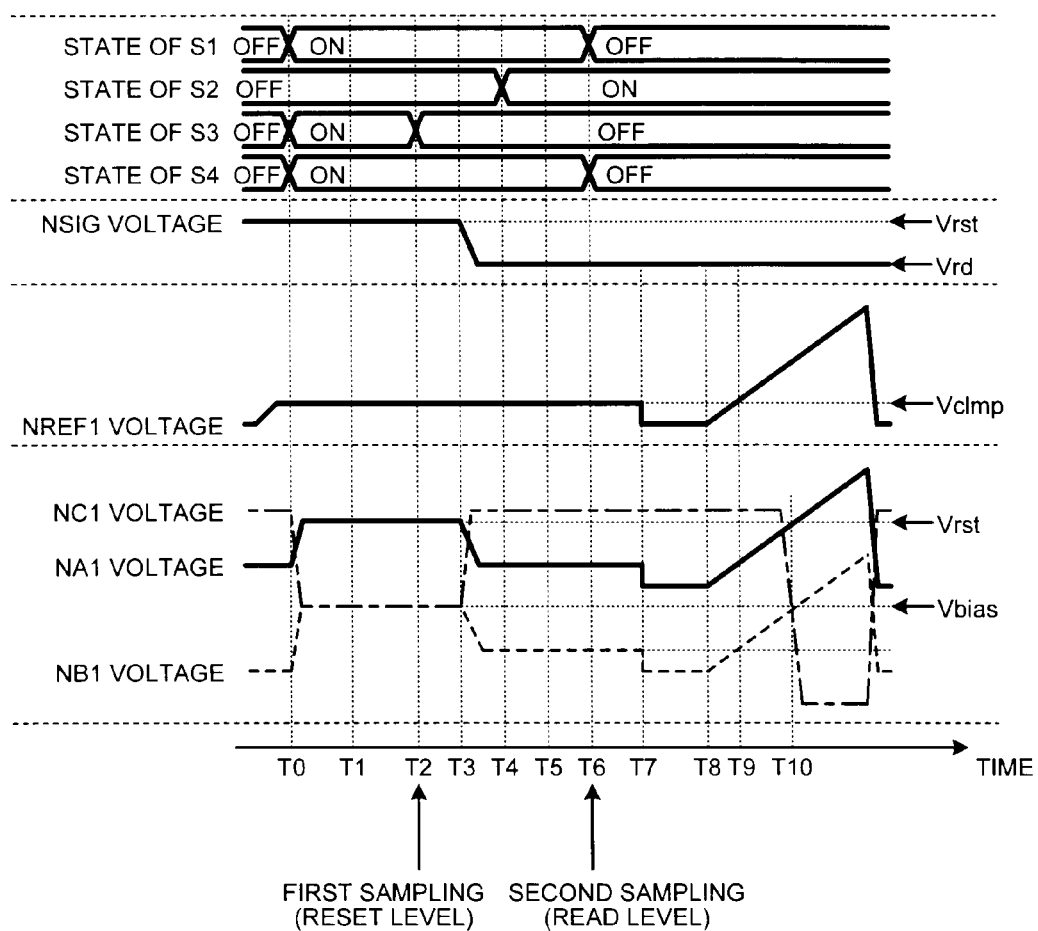
FIG. 4 is a timing diagram illustrating signal waveforms of respective units in the sample-hold signal conversion circuit illustrated in FIG. 3.

FIG. 4 is a timing diagram illustrating signal waveforms of respective units in the sample-hold signal conversion circuit illustrated in FIG. 3.

In FIG. 4, when a signal is read out from the pixel 15 illustrated in FIG. 3, the vertical signal line NSIG is connected to the power line DL and the potential of the vertical signal line NSIG is shifted to a reset level accordingly.

When the potential of the vertical signal line NSIG is to be shifted to the reset level, the switching control circuit 21 illustrated in FIG. 3 turns off the switches S1 to S4, so that the vertical signal line NSIG is disconnected from the sample-hold signal conversion circuit 16.

Then, when the sample-hold signal conversion circuit 16 performs sampling of the reset level, the switching control circuit 21 turns on the switches S1, S3, and S4 (Time T0). When the switch S1 is turned on, the vertical signal line NSIG is connected to the sample-hold signal conversion circuit 16 and an NA1 voltage reaches the voltage of the vertical signal line NSIG (Time T1). When the switch S3 is turned on, the output terminal and the inverting input terminal of the differential amplifier AMP1 are short circuited and negative feedback is applied to the differential amplifier AMP1, so that an NB1 voltage and an NC1 voltage reach the voltage of the amplifier reference voltage line NBIAS (Time T1). At Time T1, because the switch S4 is on, the voltage of the amplifier reference voltage line NBIAS equals the sum of the reference voltage generated by the reference-voltage generation circuit 24 and the power supply noise.

Then, when the switching control circuit 21 turns off the switch S3 (Time T2), the capacitor CAP2 is disconnected from the output terminal of the differential amplifier AMP1, and charge corresponding to a differential voltage between the NA1 voltage and the NB1 voltage is stored in the capacitor CAP2.

In this case, assuming that the reset level of the vertical signal line NSIG is Vrst and power supply noise superimposed on the vertical signal line NSIG is ΔVn1, an NA1 voltage Vrst_n is given by the following Equation (2).

$$Vrst\_n = Vrst + \Delta Vn1 \quad (2)$$

Furthermore, assuming that the reference voltage generated by the reference-voltage generation circuit 24 is Vbias and power supply noise output from the power-supply-noise adding circuit 23 is ΔVn1', an NB1 voltage Vbias_n1 is given by the following Equation (3).

$$Vbias\_n1 = Vbias + \Delta Vn1' \quad (3)$$

If the pixel array 11 and the power-supply-noise adding circuit 23 are supplied with power from an identical power line DL, the power supply noise ΔVn1 superimposed on the vertical signal line NSIG and the power supply noise ΔVn1' output from the power-supply-noise adding circuit 23 can be equalized at Time T2.

Therefore, assuming that the power supply noise ΔVn1 and the power supply noise ΔVn1' cancel out each other and the capacitance of the capacitor CAP2 is denoted by Cp2, the differential voltage applied to the capacitor CAP2 at Time T2, i.e., the charge Q2 stored in the capacitor CAP2 is given by the following Equation (4).

$$Q2 = Cp2(Vrst\_n - Vbias\_n1) = (Vrst - Vbias) \quad (4)$$

Then, when a read pulse is output to the read signal line RD (Time T3), the read transistor M1 is turned on. When the read transistor M1 is turned on, a voltage corresponding to the amount of charge stored in the photodiode PD is applied to the gate of the transfer transistor M4. In this case, because the transfer transistor M4 and the current source 17 function as a source follower, when the voltage corresponding to the amount of the charge stored in the photodiode PD is applied to the gate of the transfer transistor M4, the voltage of the vertical signal line NSIG follows the applied voltage, so that the voltage of the vertical signal line NSIG and the NA1 voltage are respectively shifted to read levels.

When the voltage of the vertical signal line NSIG is shifted to the read level, the switching control circuit 21 turns on the switch S2 (Time T4). When the switch S2 is turned on, the capacitor CAP1 is connected to the ramp-wave signal line NREF1, so that an NV1 voltage reaches a clamp voltage Vclmp of the ramp-wave signal line NREF1 (Time T5).

When the sample-hold signal conversion circuit 16 performs sampling of the read level, the switching control circuit 21 turns off the switches S1 and S4 (Time T6). When the switch S1 is turned off, the capacitors CAP1 and CAP2 are disconnected from the vertical signal line NSIG. When the capacitor CAP1 is disconnected from the vertical signal line NSIG, charge corresponding to a differential voltage between an NREF1 voltage and the NA1 voltage is stored in the capacitor CAP1.

In this case, assuming that the read level of the vertical signal line NSIG is Vrd and power supply noise superimposed on the vertical signal line NSIG is ΔVn2, an NA1 voltage Vrd_n is given by the following Equation (5).

$$Vrd\_n = Vrd + \Delta Vn2 \quad (5)$$

Consequently, assuming that capacitance of the capacitor CAP1 is Cp1, charge Q1 stored in the capacitor CAP1 is given by the following Equation (6).

$$Q1 = Cp1(Vclmp - Vrd\_n) \quad (6)$$

In this case, although the NA1 voltage is changed by (Vrst_n−Vrd_n) during Time T2 to Time T6, the amount of the charge in the capacitor CAP2 is not changed because of the law of conservation of charge. Therefore, an NB1 voltage Vnb is changed by the same amount of change in the NA1 voltage, and given by the following Equation (8).

$$Vnb = Vbias\_n1 - (Vrst\_n - Vrd\_n) \quad (8)$$

Assuming that power supply noise output from the power-supply-noise adding circuit 23 at this time is denoted by $\Delta Vn2'$, a voltage Vbias_n2 of the amplifier reference voltage line NBIAS at this time is given by the following Equation (9).

$$Vbias\_n2 = Vbias + \Delta Vn2' \quad (9)$$

Subsequently, when the NB1 voltage Vnb is input to the inverting input terminal of the differential amplifier AMP1 and the voltage Vbias_n2 of the amplifier reference voltage line NBIAS is input to the non-inverting input terminal of the differential amplifier AMP1, a difference between these voltages is amplified by the differential amplifier AMP1 and then output from the differential amplifier AMP1.

At this time, when an NC1 voltage Vnc1 output from the differential amplifier AMP1 is not clipped, the NC1 voltage Vnc1 is given by the following Equation (10):

$$Vnc1 = A(Vbias\_n2 - (Vbias\_n1) - (Vrst\_n - Vrd\_n) \quad (10)$$

where A is a gain of the differential amplifier AMP1.

If it is assumed that the pixel array 11 and the power-supply-noise adding circuit 23 are supplied with power from the identical power line DL, the power supply noise $\Delta Vn2$ superimposed on the vertical signal line NSIG and the power supply noise $\Delta Vn2'$ output from the power-supply-noise adding circuit 23 can be equalized at Time T6.

Therefore, at Time T6, the power supply noise $\Delta Vn2$ and the power supply noise $\Delta Vn2'$ cancel out each other, and the amount of change in the NC1 voltage Vnc1 output from the differential amplifier AMP1 is given by the following Equation (11).

$$Vnc1 = A(Vrst - Vrd) \quad (11)$$

In this case, the NC1 voltage Vnc1 output from the differential amplifier AMP1 at Time T6 contains the reset level Vrst and the read level Vrd of the vertical signal line NSIG, but does not contain the power supply noise $\Delta Vn1$ at the reset level and the power supply noise $\Delta Vn2$ at the read level.

When the sample-hold signal conversion circuit 16 ends the sampling of the read level, the ramp-wave generation circuit 22 temporarily reduces the potential of the ramp-wave signal line NREF1 (Time T7). When the potential of the ramp-wave signal line NREF1 is reduced, the NA1 voltage and the NB1 voltage are also reduced accordingly.

After temporarily reducing the potential of the ramp-wave signal line NREF1, the ramp-wave generation circuit 22 increases the potential of the ramp-wave signal line NREF1 at a constant rate (Time T8). When the potential of the ramp-wave signal line NREF1 is increased at the constant rate, the potential of the ramp-wave signal line NREF1 becomes equal to the clamp voltage (Time T9). At this time, the NB1 voltage Vnb is given by the following Equation (12).

$$Vnb = Vbias\_n - (Vrst\_n - Vrd\_n) \quad (12)$$

Then, the potential of the ramp-wave signal line NREF1 is further increased at the constant rate, and when the NB1 voltage Vnb becomes equal to the voltage Vbias_n2 of the amplifier reference voltage line NBIAS, the NC1 voltage is inverted (Time T10). At this time, because the amount of charge in the capacitor CAP2 is not changed because of the law of conservation of charge, a voltage Vref_t10 of the ramp-wave signal line NREF1 is given by the following Equation (13).

$$Vref\_t10 = Vclmp + Vbias\_n2 - (Vbias\_n1 - (Vrst\_n - Vrd\_n)) \quad (13)$$

$$= Vclmp + (Vrst\_n - Vrd\_n)$$

Then, the T/D converter 25 counts clock from Time T9 to Time T10 and converts a value of (Vrst_n−Vrd) to a digital value.

Consequently, it is possible to remove the power supply noise $\Delta Vn1$ and $\Delta Vn2$ superimposed on the signal component while simultaneously causing the sample-hold signal conversion circuit 16 to perform the sampling of the reset level and the read level.

Therefore, the power supply noise $\Delta Vn1$ and $\Delta Vn2$ superimposed on the signal component can be removed without performing the averaging process on the signal component output from the differential amplifier AMP1. As a result, processing time can be shortened and image quality can be improved.

Second Embodiment

Figure 5:
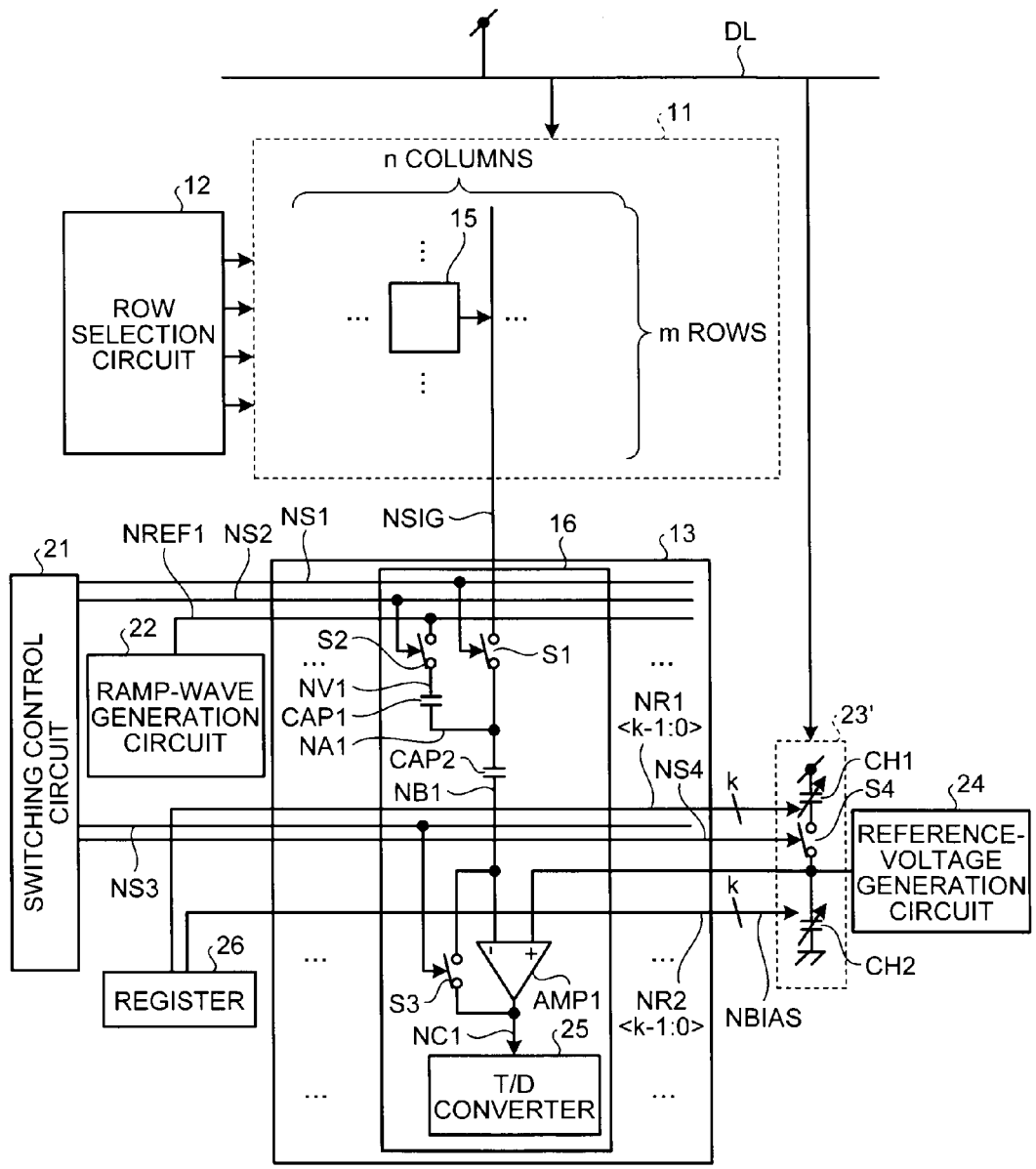
FIG. 5 is a block diagram of a general configuration of a power-supply-noise cancelling circuit applied to a sample-hold signal conversion circuit according to a second embodiment of the present invention.

FIG. 5 is a block diagram of a general configuration of a power-supply-noise cancelling circuit applied to a sample-hold signal conversion circuit according to a second embodiment of the present invention.

In FIG. 5, the power-supply-noise cancelling circuit includes a power-supply-noise adding circuit 23' instead of the power-supply-noise adding circuit 23 illustrated in FIG. 3, and further includes a register 26. The power-supply-noise adding circuit 23' includes variable capacitance elements CH1 and CH2. One end of the variable capacitance element CH1 is connected to the power supply and one end of the variable capacitance element CH2 is connected to the ground. Furthermore, the other end of the variable capacitance element CH1 is connected to the amplifier reference voltage line NBIAS via the switch S4, and the other end of the variable capacitance element CH2 is connected to the amplifier reference voltage line NBIAS.

Furthermore, the register 26 is able to select a value of the variable capacitance element CH1 via a capacitance selection line NR1<k−1:0> and select a value of the variable capacitance element CH2 via a capacitance selection line NR2<k−1:0>.

Figure 6:
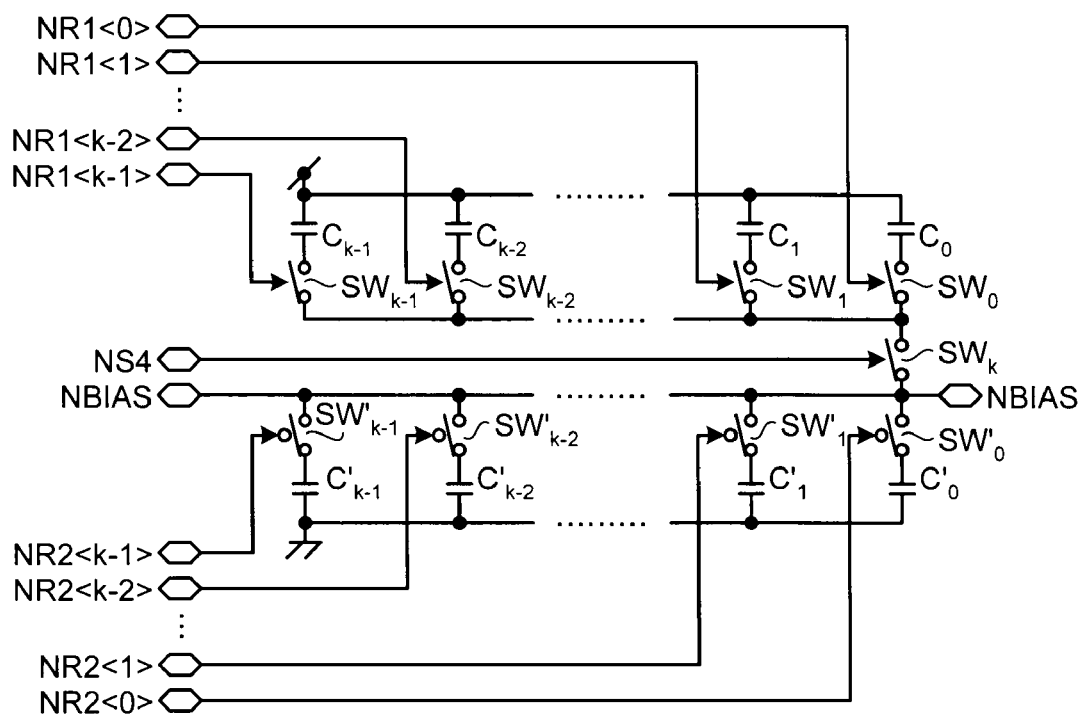
FIG. 6 is a diagram illustrating an example of a circuit configuration of a power-supply-noise adding circuit illustrated in FIG. 5.

FIG. 6 is a diagram illustrating an example of a circuit configuration of the power-supply-noise adding circuit illustrated in FIG. 5. FIG. 7 is a diagram illustrating a method of controlling capacitance of a variable capacitor by the register.

In FIG. 6, capacitors $C_0$ to $C_{k-1}$ are arranged in the variable capacitance element CH1 and capacitors $C_0'$ to $C_{k-1}'$ are arranged in the variable capacitance element CH2. One ends of the capacitors $C_0$ to $C_{k-1}$ are connected to the power supply, and one ends of the capacitors $C_0'$ to $C_{k-1}'$ are connected to the ground. Furthermore, the other ends of the capacitors $C_0$ to $C_{k-1}$ are connected to the amplifier reference voltage line NBIAS via respective switches $SW_0$ to $SW_{k-1}$ and the switch S4, and the other ends of capacitors $C_0'$ to $C_{k-1}'$ are connected to the amplifier reference voltage line NBIAS via respective switches $SW_0'$ to $SW_{k-1}'$.

Any value from 0 to $2^{k-1}$ can be set to the register 26. Accordingly, as illustrated in FIG. 7, the switches $SW_0$ to $SW_{k-1}$ and $SW_0'$ to $SW_{k-1}'$ are turned on and off depending on the value set to the register 26 to connect the capacitors $C_0$ to $C_{k-1}$ and $C_0'$ to $C_{k-1}'$ to the amplifier reference voltage line NBIAS to thereby change the capacitance added to the amplifier reference voltage line NBIAS. In this case, it is preferable to set the value of the register 26 so that the values of the variable capacitance elements CH1 and CH2 become equal to the values of the parasitic capacitance CF1 and CF2 illustrated in FIG. 2.

The power-supply-noise cancelling circuit illustrated in FIG. 5 is able to operate according to the timing diagram of FIG. 4. Assuming that a gain of the pixel 15 is α, power supply noise output to the vertical signal line NSIG at the time of sampling of the reset level becomes α×ΔVn1, and power supply noise output to the vertical signal line NSIG at the time of sampling of a charge read level becomes α×ΔVn2.

On the other hand, power supply noise of the amplifier reference voltage line NBIAS at the time of sampling of the reset level becomes β×ΔVn1 and power supply noise of the amplifier reference voltage line NBIAS at the time of the read level becomes β×ΔVn2, where β is a gain of the power-supply-noise adding circuit 23'.

Consequently, the voltage Vref_t10 of the ramp-wave signal line NREF1 at Time T10 of FIG. 4 is given by the following Equation (14).

$$\text{Vref\_t10} = V\text{clmp} + V\text{bias\_2} - (V\text{bias\_n1} - (V\text{rst\_n} - V\text{rd\_n})) \quad (14)$$
$$= V\text{clamp} + (V\text{rst} - V\text{rd}) + (\beta - \alpha) \times$$
$$\Delta Vn2 - (\beta - \alpha) \times \Delta Vn1$$

When the gain β of the power-supply-noise adding circuit 23' is set such that β=α, the voltage Vref_t10 of the ramp-wave signal line NREF1 is given by the following Equation (15), so that the power supply noise ΔVn1 and ΔVn2 can be removed.

$$\text{Vref\_t10} = V\text{clmp} + (V\text{rst} - V\text{rd}) \quad (15)$$

In this case, by changing the value of the register 26, the values of the variable capacitance elements CH1 and CH2 can be changed. Therefore, even when the values of the parasitic capacitance CF1 and CF2 illustrated in FIG. 2 are changed, it is possible to remove the power supply noise ΔVn1 and ΔVn2 superimposed on the signal component while simultaneously causing the sample-hold signal conversion circuit 16 to perform the sampling of the reset level and the read level.

Third Embodiment

Figure 8:
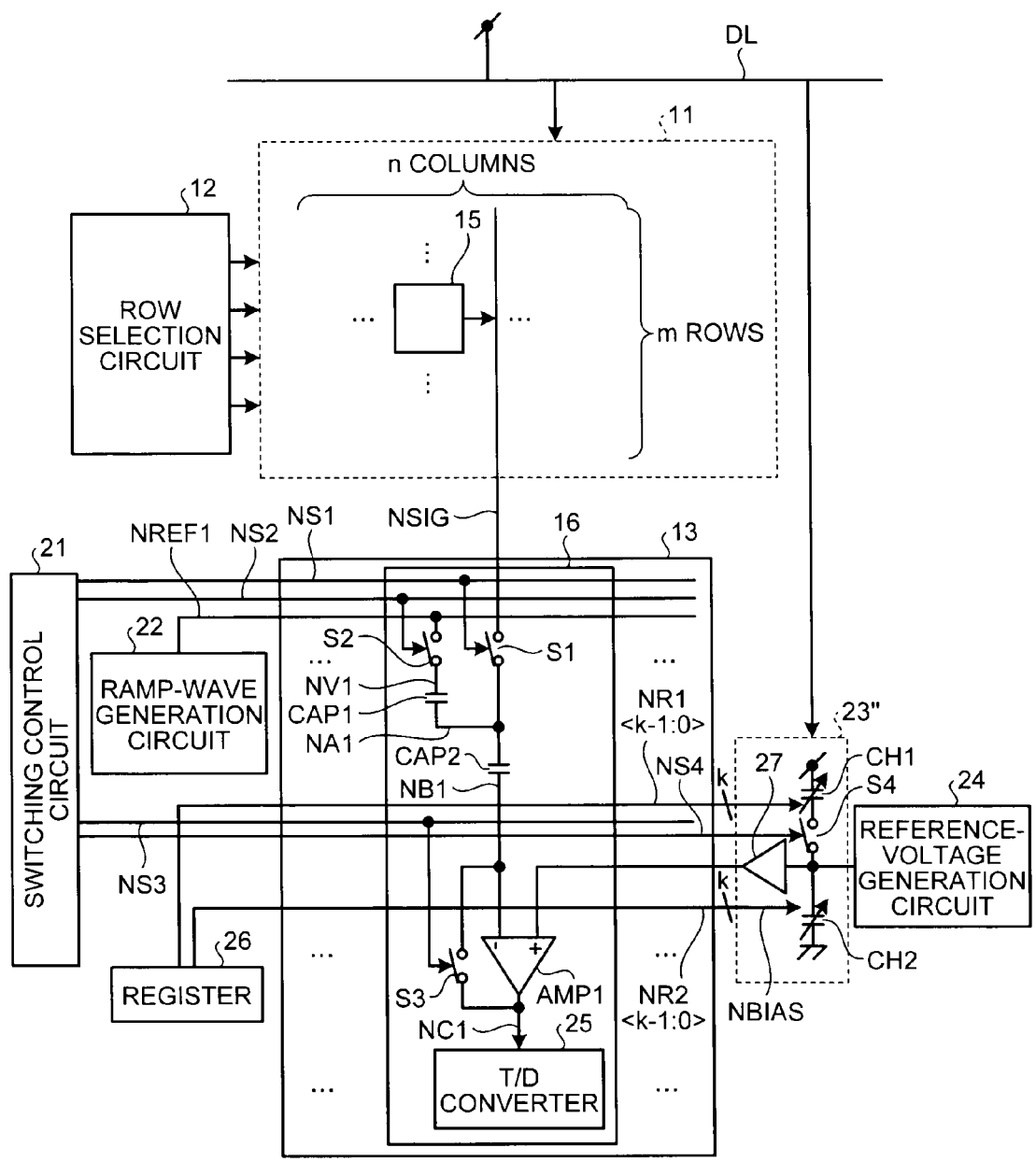
FIG. 8 is a block diagram of a general configuration of a power-supply-noise cancelling circuit applied to a sample-hold signal conversion circuit according to a third embodiment of the present invention.

FIG. 8 is a block diagram of a general configuration of a power-supply-noise cancelling circuit applied to a sample-hold signal conversion circuit according to a third embodiment of the present invention.

In FIG. 8, the power-supply-noise cancelling circuit includes a power-supply-noise adding circuit 23" instead of the power-supply-noise adding circuit 23' illustrated in FIG. 5. The power-supply-noise adding circuit 23" includes a buffer 27 in addition to the configuration of the power-supply-noise adding circuit 23'. The buffer 27 is disposed between the variable capacitance element CH2 and the differential amplifier AMP1.

Figure 9:
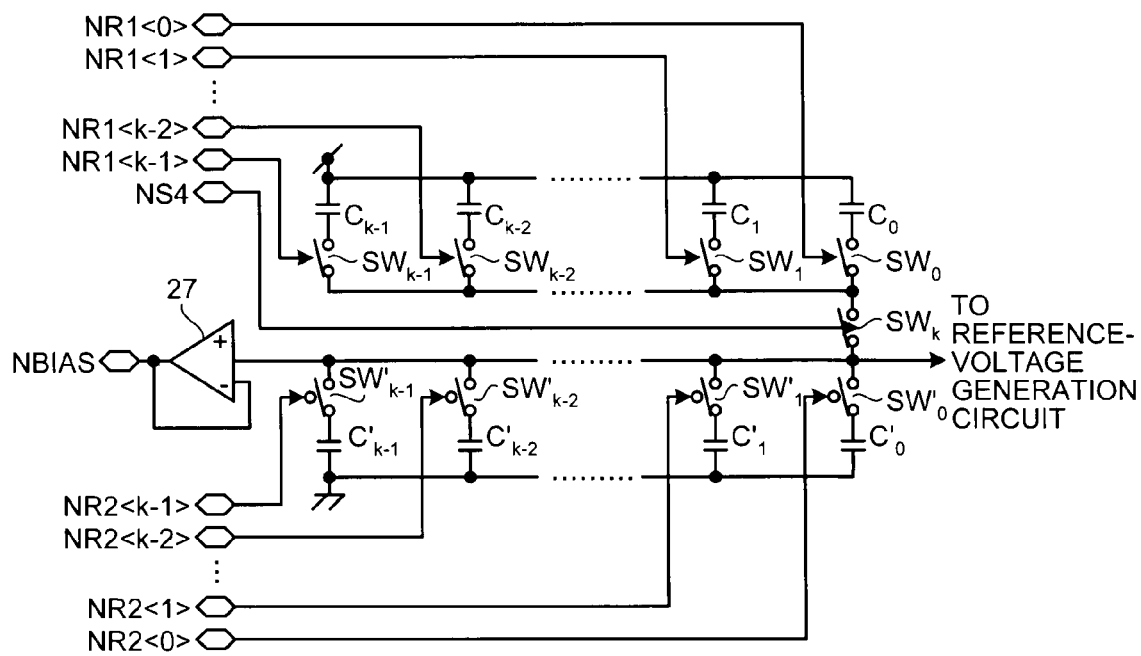
FIG. 9 is a diagram illustrating an example of a circuit configuration of a power-supply-noise adding circuit illustrated in FIG. 8.

FIG. 9 is a diagram illustrating an example of a circuit configuration of the power-supply-noise adding circuit illustrated in FIG. 8.

In FIG. 9, the power-supply-noise adding circuit 23" illustrated in FIG. 8 includes the buffer 27 in addition to the configuration illustrated in FIG. 6. The buffer 27 is disposed between the switch $SW_{k-1}'$ and the differential amplifier AMP1 illustrated in FIG. 8.

The power-supply-noise adding circuit illustrated in FIG. 8 is able to operate according to the timing diagram of FIG. 4. Assuming that a gain of the pixel 15 is α and a gain of the power-supply-noise adding circuit 23" is β, and the gain β is set such that β=α, the voltage Vref_t10 of the ramp-wave signal line NREF1 at Time T10 of FIG. 4 is given by Equation (15), so that the power supply noise ΔVn1 and ΔVn2 can be removed.

By disposing the buffer 27 between the variable capacitance element CH2 and the differential amplifier AMP1, it is possible to prevent the power-supply-noise adding circuit 23" from being affected by parasitic capacitance of the amplifier reference voltage line NBIAS. Therefore, even when a large number of differential amplifiers AMP1 are connected in parallel to the amplifier reference voltage line NBIAS, accuracy of the power supply noise output from the power-supply-noise adding circuit 23" can be maintained constant.

Fourth Embodiment

Figure 10:
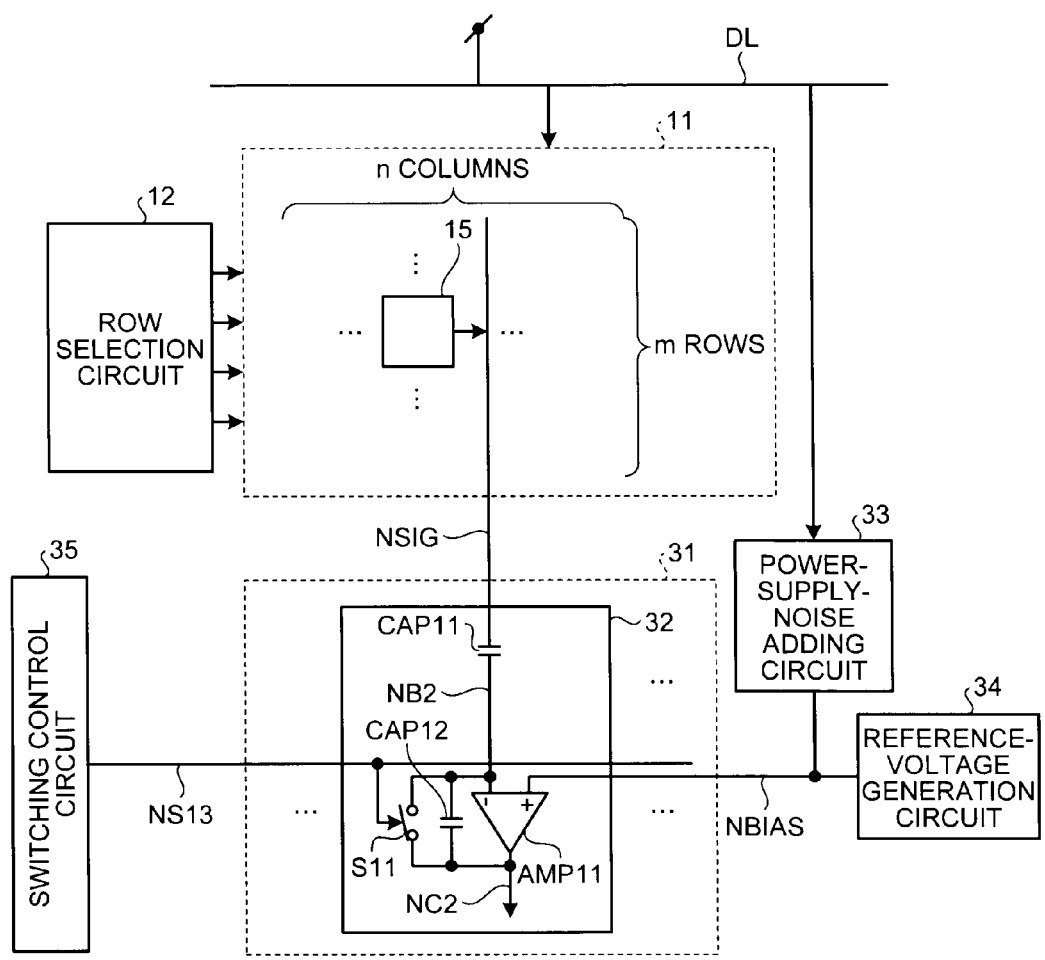
FIG. 10 is a block diagram of a general configuration of a power-supply-noise cancelling circuit applied to a signal conversion circuit according to a fourth embodiment of the present invention.

FIG. 10 is a block diagram of a general configuration of a power-supply-noise cancelling circuit applied to a signal conversion circuit according to a fourth embodiment of the present invention.

In FIG. 10, a CMOS image sensor includes a signal conversion circuit group 31 instead of the sample-hold signal conversion circuit group 13 illustrated in FIG. 1. In the signal conversion circuit group 31, signal conversion circuits 32 are arranged for respective columns of the array of the pixels 15. The signal conversion circuits 32 are connected to each pixel 15 via the vertical signal lines NSIG per column. The signal conversion circuits 32 are able to perform a process of detecting a signal read out from each pixel 15.

The power-supply-noise cancelling circuit includes the signal conversion circuits 32, a switching control circuit 35, a power-supply-noise adding circuit 33, and a reference-voltage generation circuit 34. The switching control circuit 35, the power-supply-noise adding circuit 33, and the reference-voltage generation circuit 34 can be shared by all the signal conversion circuits 32 included in the signal conversion circuit group 31.

The signal conversion circuit 32 includes a switch S11, capacitors CAP11 and CAP12, and a differential amplifier AMP11. One end of the capacitor CAP11 is connected to the vertical signal line NSIG. The other end of the capacitor CAP11 is connected to an inverting input terminal of the differential amplifier AMP11. A non-inverting input terminal of the differential amplifier AMP11 is connected to the amplifier reference voltage line NBIAS, and an output terminal of the differential amplifier AMP11 is connected to the inverting input terminal of the differential amplifier AMP11 via the capacitor CAP12. The switch S11 is connected in parallel to the capacitor CAP12.

The reference-voltage generation circuit 34 is able to generate a reference voltage and output it to the amplifier reference voltage line NBIAS. The power-supply-noise adding circuit 33 is able to add power supply noise superimposed on the power supply to the reference voltage generated by the reference-voltage generation circuit 34. An output terminal of the power-supply-noise adding circuit 33 is connected to the amplifier reference voltage line NBIAS. A variable capacitance element connected to the power supply for example may be used as the power-supply-noise adding circuit 33, and a value of the variable capacitance element may be adjusted to values of the parasitic capacitance CF1 and CF2 illustrated in FIG. 2. Alternatively, a constant capacitance element may be used instead of the variable capacitance element. The switching control circuit 35 is able to control ON/OFF of the pixel array 11 via a reset control line N13.

Figure 11:
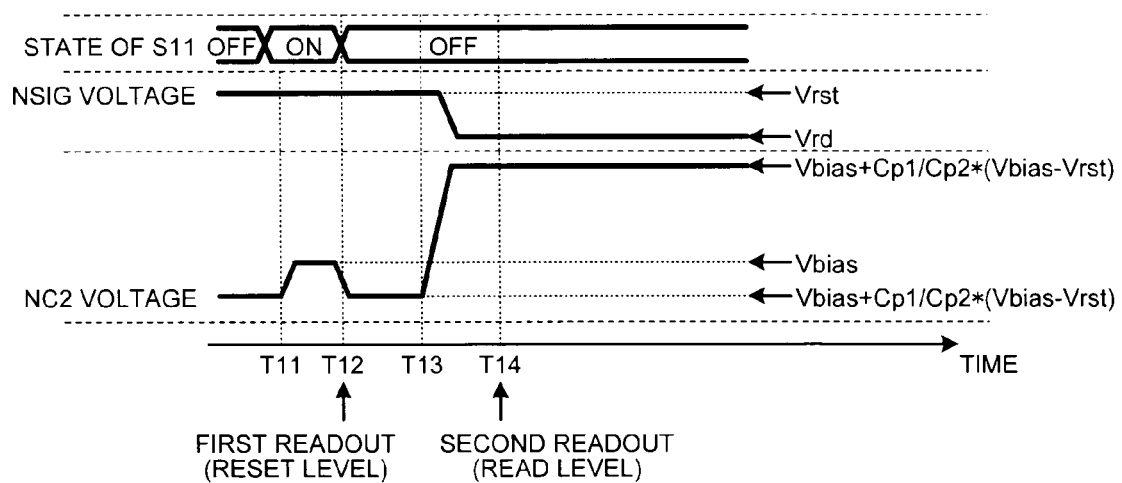
FIG. 11 is a timing diagram illustrating signal waveforms of respective units in the signal conversion circuit illustrated in FIG. 10.

FIG. 11 is a timing diagram illustrating signal waveforms of respective units in the signal conversion circuit illustrated in FIG. 10.

In FIG. 11, when a signal is read out from the pixel 15 illustrated in FIG. 10, the vertical signal line NSIG is connected to the power line DL and the potential of the vertical signal line NSIG is shifted to the reset level accordingly. When the potential of the vertical signal line NSIG is to be shifted to the reset level, the switching control circuit 35 illustrated in FIG. 10 turns off the switch S11.

When the potential of the vertical signal line NSIG is shifted to the reset level, the switching control circuit 35 turns on the switch S11. When the switch S11 is turned on, the output terminal and the inverting input terminal of the differential amplifier AMP11 are short circuited and negative feedback is applied to the differential amplifier AMP11, so that an NB2 voltage and an NC2 voltage reach the voltage of the amplifier reference voltage line NBIAS (Time T11). Because the power-supply-noise adding circuit 33 is connected to the amplifier reference voltage line NBIAS, an voltage of the amplifier reference voltage line NBIAS equals the sum of the reference voltage generated by the reference-voltage generation circuit 34 and power supply noise.

Then, when the switching control circuit 35 turns off the switch S11 (Time T12), the output terminal of the differential amplifier AMP11 is connected to the inverting input terminal via the capacitor CAP12, and the differential amplifier AMP11 outputs a voltage corresponding to a difference between the voltage of the amplifier reference voltage line NBIAS and the NB2 voltage at this time.

At Time T12, assuming that the reset level of the vertical signal line NSIG is Vrst and power supply noise superimposed on the vertical signal line NSIG is ΔVn1, a voltage Vrst_n of the vertical signal line NSIG is given by the following Equation (16).

$$Vrst\_n = Vrst + \Delta Vn1 \tag{16}$$

Meanwhile, at Time T12, assuming that the reference voltage generated by the reference-voltage generation circuit 34 is Vbias and power supply noise output from the power-supply-noise adding circuit 33 is aΔVn1, a voltage Vbias_n1 of the amplifier reference voltage line NBIAS is given by the following Equation (17).

$$Vbias\_n1 = Vbias + a\Delta Vn1 \tag{17}$$

Because the negative feedback is applied to the differential amplifier AMP11 via the capacitor CAP12, an NB2 voltage Vnb becomes equal to the voltage Vbias_n1 of the amplifier reference voltage line NBIAS.

In this case, assuming that the NC2 voltage output from the differential amplifier AMP11 is Vnc1, capacitance of the capacitor CAP11 is Cp1, and capacitance of the capacitor CAP12 is Cp2, the following Equation (18) is given according to the law of conservation of charge.

$$Cp1(Vrst\_n - Vbias\_n1) = Cp2(Vbias\_n1 - Vnc1) \tag{18}$$

Consequently, an NC2 voltage Vnc1 output from the differential amplifier AMP11 at Time T12 is given by the following Equation (19).

$$Vnc1 = Vbias + Cp1/Cp2 \times (Vbias - Vrst) + \{a + Cp1/Cp2 \times (a-1)\} \times \Delta Vn1 \tag{19}$$

By setting the gain a to satisfy the following Equation (20) or the following Equation (21), it is possible to remove the power supply noise ΔVn1 at the reset level.

$$a + Cp1/Cp2 \times (a-1) = 0 \tag{20}$$

$$a = Cp1/(Cp1 + Cp2) \tag{21}$$

Then, when a read pulse is output to the read signal line RD (Time T13), the read transistor M1 illustrated in FIG. 2 is turned on. When the read transistor M1 is turned on, a voltage corresponding to the amount of charge stored in the photodiode PD is applied to the gate of the transfer transistor M4. In this case, because the transfer transistor M4 and the current source 17 function as a source follower, when the voltage corresponding to the amount of the charge stored in the photodiode PD is applied to the gate of the transfer transistor M4, the voltage of the vertical signal line NSIG follows the applied voltage, so that the voltage of the vertical signal line NSIG is shifted to the read level (Time T14).

Then, when the voltage of the vertical signal line NSIG is shifted to the read level, the differential amplifier AMP11 outputs a voltage corresponding to a difference between the voltage of the amplifier reference voltage line NBIAS and the NB2 voltage at this time.

At time T14, assuming that the read level of the vertical signal line NSIG is Vrd and power supply noise superimposed on the vertical signal line NSIG is ΔVn2, a voltage Vrd_n of the vertical signal line NSIG is given by the following Equation (22).

$$Vrd\_n = Vrd + \Delta Vn2 \tag{22}$$

Meanwhile, at Time T14, assuming that the reference voltage generated by the reference-voltage generation circuit 34 is Vbias and power supply noise output from the power-supply-noise adding circuit 33 is aΔVn2, a voltage Vbias_n2 of the amplifier reference voltage line NBIAS is given by the following Equation (23).

$$Vbias\_n2 = Vbias + a\Delta Vn2 \tag{23}$$

Because the negative feedback is applied to the differential amplifier AMP11 via the capacitor CAP12, an NB2 voltage Vnb becomes equal to the voltage Vbias_n2 of the amplifier reference voltage line NBIAS.

Consequently, an NC2 voltage Vnc2 output from the differential amplifier AMP11 at Time T14 is given by the following Equation (24).

$$Vnc2 = Vbias + Cp1/Cp2 \times (Vbias - Vrst) + \{a + Cp1/Cp2 \times (a-1)\} \times \Delta Vn2 \tag{24}$$

By setting the gain a to satisfy the above Equation (21), it is possible to remove the power supply noise ΔVn2 at the read level.

Consequently, it is possible to remove the power supply noise ΔVn1 and ΔVn2 superimposed on the signal component without causing the signal conversion circuits 32 to perform the sampling of the reset level and the sampling of the read level. As a result, processing time can be shortened and image quality can be improved.

Fifth Embodiment

Figure 12:
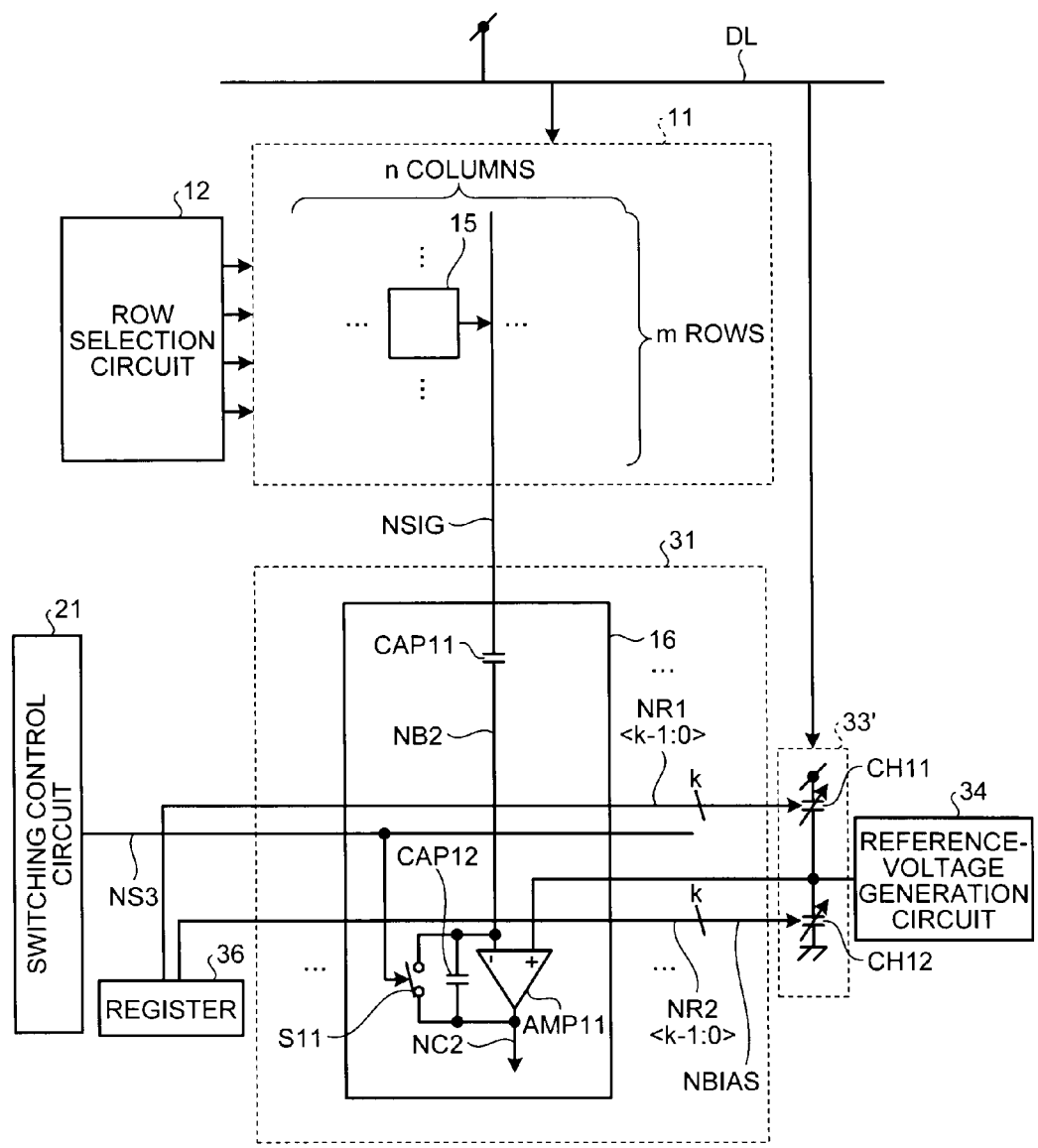
FIG. 12 is a block diagram of a general configuration of a power-supply-noise cancelling circuit applied to a signal conversion circuit according to a fifth embodiment of the present invention.

FIG. 12 is a block diagram of a general configuration of a power-supply-noise cancelling circuit applied to a signal conversion circuit according to a fifth embodiment of the present invention.

In FIG. 12, the power-supply-noise cancelling circuit includes a power-supply-noise adding circuit 33' instead of the power-supply-noise adding circuit 33 illustrated in FIG.

10, and further includes a register 36. The power-supply-noise adding circuit 33' includes variable capacitance elements CH11 and CH12. One end of the variable capacitance element CH11 is connected to the power supply, and one end of the variable capacitance element CH2 is connected to the ground. The other end of the variable capacitance element CH11 and the other end of the variable capacitance element CH12 are connected to the amplifier reference voltage line NBIAS.

The register 36 is able to select a value of the variable capacitance element CH11 via the capacitance selection line NR1<k−1:0> and select a value of the variable capacitance element CH12 via the capacitance selection line NR2<k−1:0>.

Figure 13:
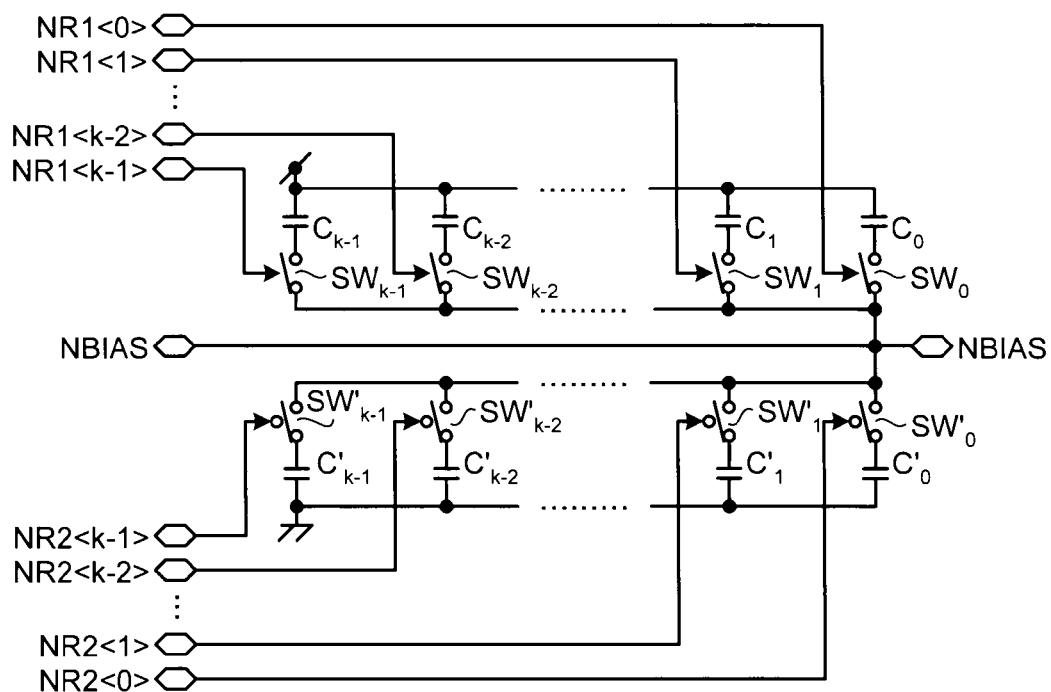
FIG. 13 is a diagram illustrating an example of a circuit configuration of a power-supply-noise adding circuit illustrated in FIG. 12.

FIG. 13 is a diagram illustrating an example of a circuit configuration of a power-supply-noise adding circuit illustrated in FIG. 12.

In FIG. 13, capacitors $C_0$ to $C_{k-1}$ are arranged in the variable capacitance element CH11 and capacitors $C_0'$ to $C_{k-1}'$ are arranged in the variable capacitance element CH12. One ends of the capacitors $C_0$ to $C_{k-1}$ are connected to the power supply, and one ends of the capacitors $C_0'$ to $C_{k-1}'$ are connected to the ground. Furthermore, the other ends of the capacitors $C_0$ to $C_{k-1}$ are connected to the amplifier reference voltage line NBIAS via respective switches $SW_0$ to $SW_{k-1}$ and the switch S4, and the other ends of capacitors $C_0'$ to $C_{k-1}'$ are connected to the amplifier reference voltage line NBIAS via respective switches $SW_0'$ to $SW_{k-1}'$.

Any value from 0 to $2^{k-1}$ can be set to the register 36. Accordingly, as illustrated in FIG. 7, the switches $SW_0$ to $SW_{k-1}$ and $SW_0'$ to $SW_{k-1}'$ are turned on and off depending on the value set to the register 36 to connect the capacitors $C_0$ to $C_{k-1}$ and $C_0'$ to the amplifier reference voltage line NBIAS to thereby change the capacitance added to the amplifier reference voltage line NBIAS. In this case, it is preferable to set the value of the register 36 so that the values of the variable capacitance elements CH11 and CH12 become equal to the values of the parasitic capacitance CF1 and CF2 illustrated in FIG. 2.

The power-supply-noise cancelling circuit illustrated in FIG. 12 is able to operate according to the timing diagram of FIG. 11. At Time T12 of FIG. 11, assuming that the reset level output to the vertical signal line NSIG is Vrst, the gain of the pixel 15 to power supply noise is α, and the power supply noise is α×ΔVn1, an voltage Vrst_n of the vertical signal line NSIG is given by the following Equation (25).

$$Vrst\_n = Vrst + \alpha \times \Delta Vn1 \qquad (25)$$

Furthermore, β times power supply noise ΔVn1 is output from the power-supply-noise adding circuit 33' to the amplifier reference voltage line NBIAS, where β is a gain of the power-supply-noise adding circuit 33'. Therefore, assuming that the reference voltage generated by the reference-voltage generation circuit 34 is Vbias, the voltage Vbias_n1 of the amplifier reference voltage line NBIAS is given by the following Equation (26).

$$Vbias\_n1 = Vbias + \beta \times \Delta Vn1 \qquad (26)$$

Because the negative feedback is applied to the differential amplifier AMP11 via the capacitor CAP12, the NB2 voltage Vnb becomes equal to the voltage Vbias_n1 of the amplifier reference voltage line NBIAS.

At this time, assuming that the NC2 voltage is Vnc1, the capacitance of the capacitor CAP11 is Cp1, and the capacitance of the capacitor CAP12 is Cp2, the following Equation is given according to the law of conservation of charge.

$$Cp1(Vrst\_n - Vbias\_n1) = Cp2(Vbias\_n1 - Vnc1)$$

Consequently, at Time T12, the NC2 voltage Vnc1 is given by the following Equation (27).

$$Vnc = Vbias + Cp1/Cp2 \times (Vbias - Vrst) + \{\beta + Cp1/Cp2 \times (Vbias - Vrst)\} \times \Delta Vn1 \qquad (27)$$

By setting the gain β to satisfy the following Equation (28) or the following Equation (29), Equation (27) can be transformed into the following Equation (30). Consequently, the power supply noise ΔVn1 at the reset level can be removed.

$$\beta + Cp1/Cp2 \times (\beta - \alpha) = 0 \qquad (28)$$

$$\beta = Cp1/(Cp1 + Cp2) \times \alpha \qquad (29)$$

$$Vnc1 = Vbias + Cp1/Cp2 \times (Vbias - Vrst) \qquad (30)$$

Next, at Time T14 of FIG. 11, assuming that the read level output to the vertical signal line NSIG is Vrd and power supply noise is α×ΔVn2, the NC2 voltage Vnc2 is given by the following Equation (31).

$$Vnc2 = Vbias + Cp1/Cp2 \times (Vbias - Vrd) + \{\beta + Cp1/Cp2 \times (\beta - \alpha)\} \times \Delta Vn2 \qquad (31)$$

By setting the gain β to satisfy Equation (28), Equation (31) can be transformed into the following Equation (32). Consequently, the power supply noise ΔVn2 at the read level can be removed.

$$Vnc2 = Vbias + Cp1/Cp2 \times (Vbias - Vrd) \qquad (32)$$

In this case, by changing the value of the register 36, the values of the variable capacitance elements CH11 and CH12 can be changed. Therefore, even when the values of the parasitic capacitance CF1 and CF2 illustrated in FIG. 2 are changed, it is possible to remove the power supply noise ΔVn1 and ΔVn2 superimposed on the signal component without causing the signal conversion circuits 32 to perform the sampling of the reset level and the sampling of the read level.

Sixth Embodiment

Figure 14:
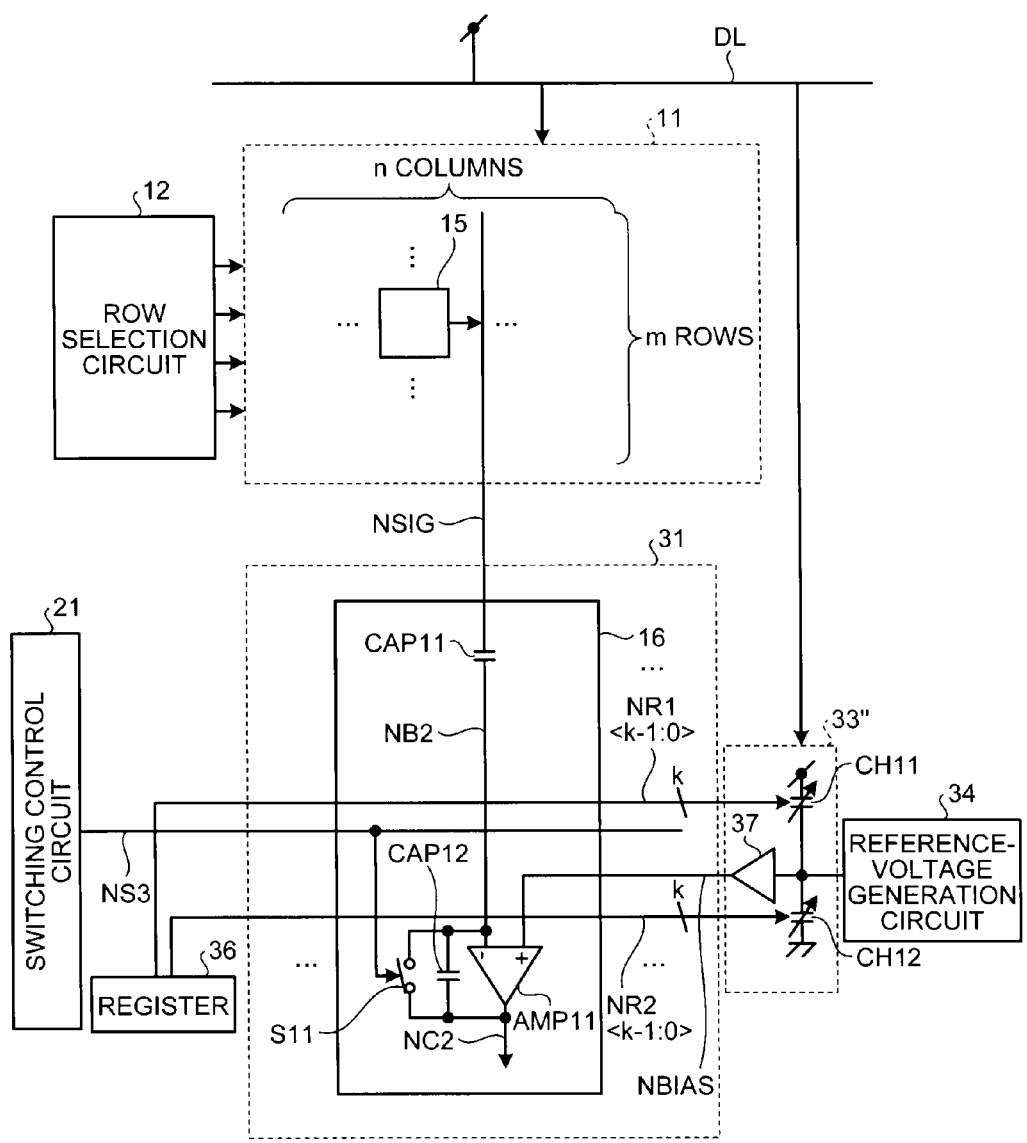
FIG. 14 is a block diagram of a general configuration of a power-supply-noise cancelling circuit applied to a signal conversion circuit according to a sixth embodiment of the present invention.

FIG. 14 is a block diagram of a general configuration of a power-supply-noise cancelling circuit applied to a signal conversion circuit according to a sixth embodiment of the present invention.

In FIG. 14, the power-supply-noise cancelling circuit includes a power-supply-noise adding circuit 33" instead of the power-supply-noise adding circuit 33' illustrated in FIG. 12. The power-supply-noise adding circuit 33" includes a buffer 37 in addition to the configuration of the power-supply-noise adding circuit 33'. The buffer 37 is disposed between the variable capacitance element CH12 and the differential amplifier AMP11.

Figure 15:
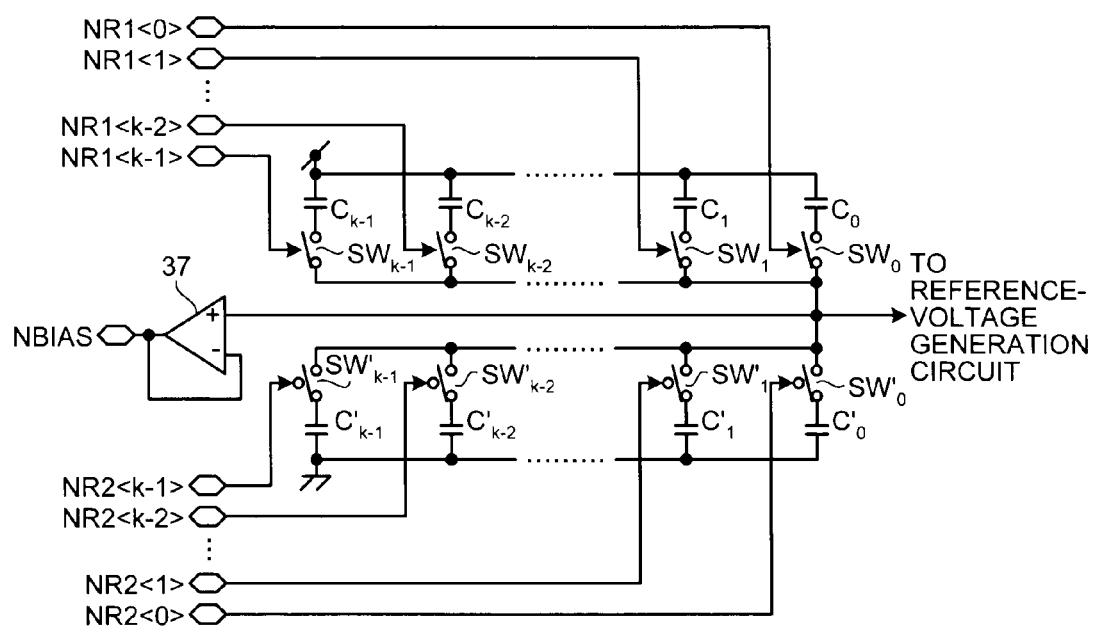
FIG. 15 is a diagram illustrating an example of a circuit configuration of a power-supply-noise adding circuit illustrated in FIG. 14.

FIG. 15 is a diagram illustrating an example of a circuit configuration of a power-supply-noise adding circuit illustrated in FIG. 14.

In FIG. 15, the power-supply-noise adding circuit 33" illustrated in FIG. 14 includes the buffer 37 in addition to the configuration illustrated in FIG. 13. The buffer 37 is disposed between the switch $SW_{k-1}'$ and the differential amplifier AMP11 illustrated in FIG. 14.

The power-supply-noise circuit illustrated in FIG. 14 is able to operate according to the timing diagram of FIG. 11. Here, it is assumed that the gain of the pixel 15 to the power supply noise is α and a gain of the power-supply-noise adding circuit 33" is β. Furthermore, assuming that the reset level output to the vertical signal line NSIG is Vrst, power supply noise is α×ΔVn1, a voltage of the amplifier reference voltage line NBIAS is Vbis+β×ΔVn1, the capacitance of the capacitor CAP11 is Cp1, and the capacitance of the capacitor CAP12 is Cp2, the NC2 voltage Vnc1 is given by Equation (27).

In this case, by setting the gain β to satisfy Equation (28), Equation (27) can be transformed into Equation (30). Consequently, the power supply noise ΔVn2 at the reset level can be removed.

Next, at Time T14 of FIG. 11, assuming that the read level output to the vertical signal line NSIG is Vrd and power supply noise is α×ΔVn2, the NC2 voltage Vnc2 is given by Equation (31).

By setting the gain β to satisfy Equation (28), Equation (31) can be transformed into Equation (32). Consequently, the power supply noise ΔVn2 at the read level can be removed.

By disposing the buffer 37 between the variable capacitance element CH12 and the differential amplifier AMP11, it is possible to prevent the power-supply-noise adding circuit 33" from being affected by parasitic capacitance of the amplifier reference voltage line NBIAS. Therefore, even when a large number of differential amplifiers AMP11 are connected in parallel to the amplifier reference voltage line NBIAS, accuracy of the power supply noise output from the power-supply-noise adding circuit 33" can be maintained constant.

Seventh Embodiment

Figure 16:
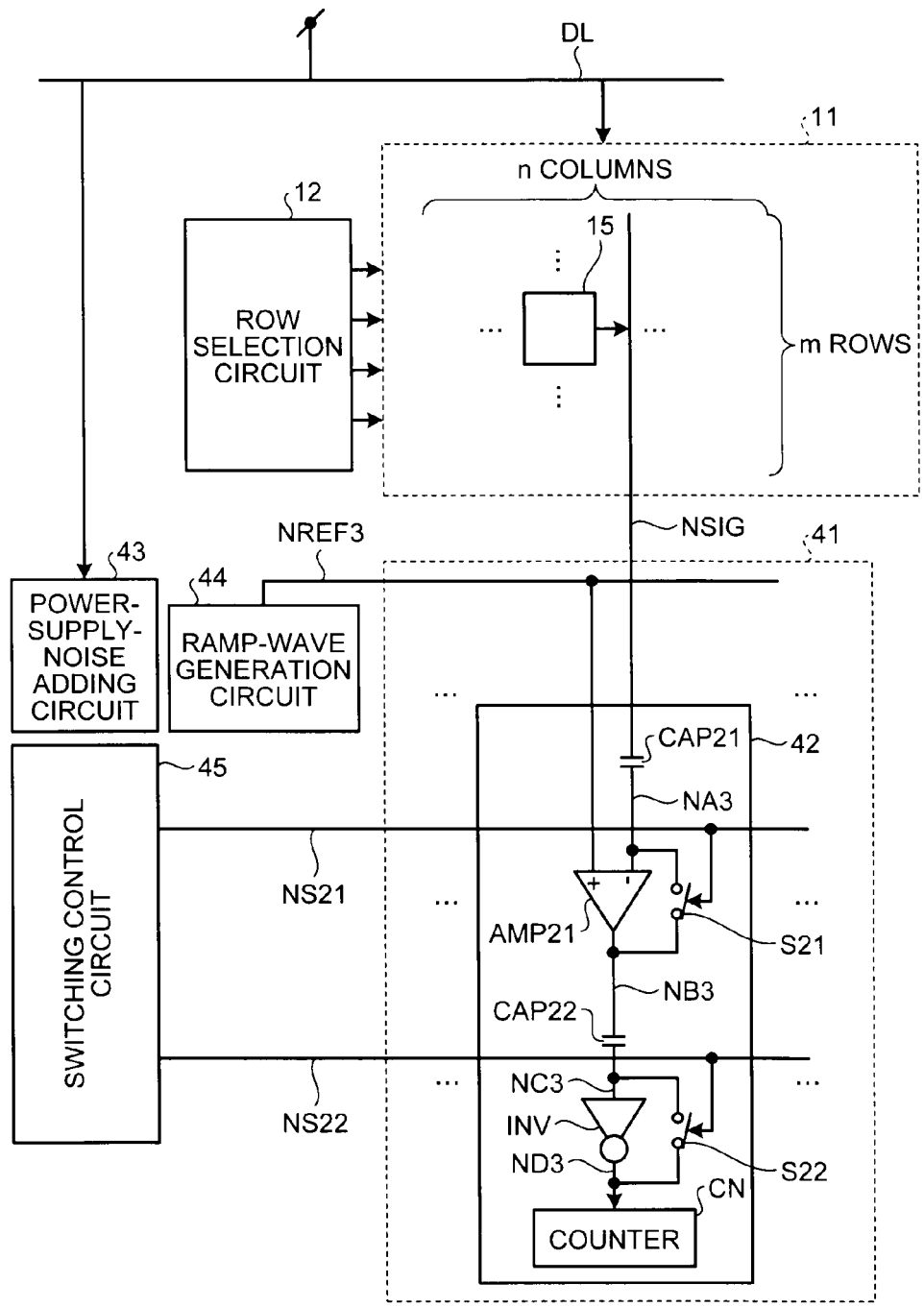
FIG. 16 is a block diagram of a general configuration of a power-supply-noise cancelling circuit applied to a signal conversion circuit according to a seventh embodiment of the present invention.

FIG. 16 is a block diagram of a general configuration of a power-supply-noise cancelling circuit applied to a signal conversion circuit according to a seventh embodiment of the present invention.

In FIG. 16, a CMOS image sensor includes a signal conversion circuit group 41 instead of the sample-hold signal conversion circuit group illustrated in FIG. 1. In the signal conversion circuit group 41, signal conversion circuits 42 are arranged for respective columns of the array of the pixels 15. The signal conversion circuits 42 are connected to each pixel 15 via the vertical signal lines NSIG per column. The signal conversion circuits 42 are able to perform a process of detecting a signal read out from each pixel 15.

The power-supply-noise cancelling circuit includes the signal conversion circuit 42, a switching control circuit 45, a ramp-wave generation circuit 44, and a power-supply-noise adding circuit 43. The switching control circuit 45, the ramp-wave generation circuit 44, and the power-supply-noise adding circuit 43 can be shared by all the signal conversion circuits 42 included in the signal conversion circuit group 41.

The signal conversion circuit 42 includes switches S21 and S22, capacitors CAP21 and CAP22, a differential amplifier AMP21, an inverter INV, and a counter CN. An up-down counter for example can be used as the counter CN.

One end of the capacitor CAP21 is connected to the vertical signal line NSIG. The other end of the capacitor CAP21 is connected to an inverting input terminal of the differential amplifier AMP21. A non-inverting input terminal of the differential amplifier AMP21 is connected to a ramp-wave signal line NREF3. An output terminal of the differential amplifier AMP21 is connected to the counter CN via the capacitor CAP22 and the inverter INV in this order. The output terminal of the differential amplifier AMP21 is also connected to the inverting input terminal of the differential amplifier AMP21 via the switch S21. An output terminal of the inverter INV is connected to an input terminal of the inverter INV via the switch S22.

The ramp-wave generation circuit 44 is able to generate a ramp wave signal and output it to the ramp-wave signal line NREF3. The power-supply-noise adding circuit 43 is able to add power supply noise superimposed on the power supply to the ramp wave signal generated by the ramp-wave generation circuit 44. A variable capacitance element connected to the power supply for example may be used as the power-supply-noise adding circuit 43, and a value of the variable capacitance element may be adjusted to the values of the parasitic capacitance CF1 and CF2 illustrated in FIG. 2. Alternatively, a constant capacitance element may be used instead of the variable capacitance element.

The switching control circuit 45 is able to control ON/OFF of the switch S21 via a reset control line NS21 and ON/OFF of the switch S22 via a reset control line NS22.

Figure 17:
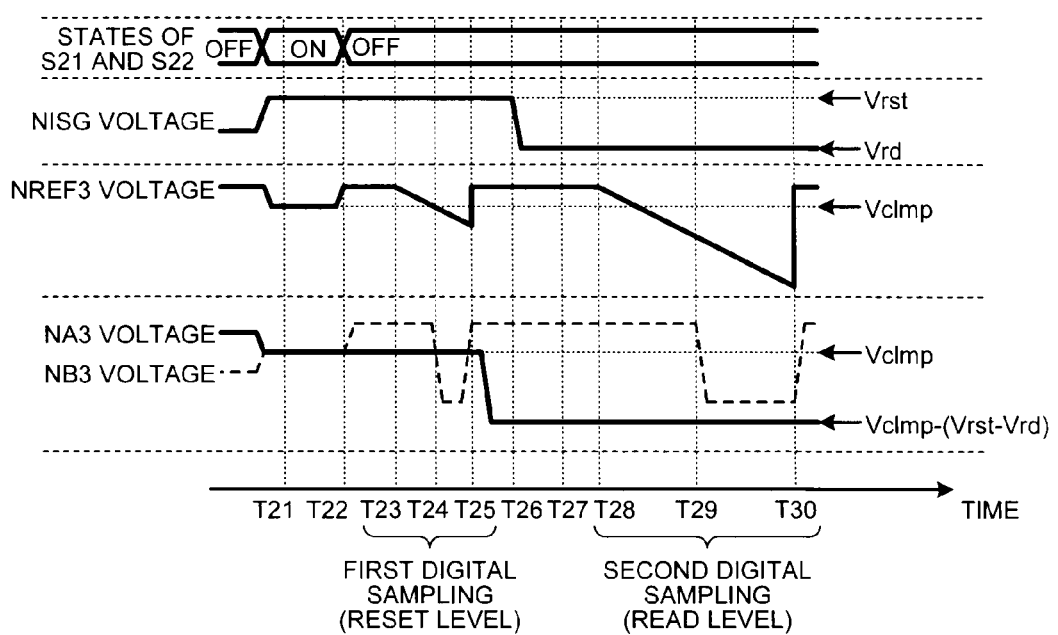
FIG. 17 is a timing diagram illustrating signal waveforms of respective units in the signal conversion circuit illustrated in FIG. 16.

FIG. 17 is a timing diagram illustrating signal waveforms of respective units in the signal conversion circuit illustrated in FIG. 16.

In FIG. 17, when a signal is read out from the pixel 15 illustrated in FIG. 16, the vertical signal line NSIG is connected to the power line DL and the potential of the vertical signal line NSIG is shifted to the reset level accordingly. When the potential of the vertical signal line NSIG is to be shifted to the reset level, the switching control circuit 45 illustrated in FIG. 16 turns off the switches S21 and S22.

Then, when the potential of the vertical signal line NSIG is shifted to the reset level, the switching control circuit 45 turns on the switches S21 and S22. When the switch S21 is turned on, the output terminal and the inverting input terminal of the differential amplifier AMP21 are short circuited and the negative feedback is applied to the differential amplifier AMP21, so that an NA3 voltage and NB3 voltage reach a voltage of the ramp-wave signal line NREF3 (Time T21).

Furthermore, charge corresponding to a difference between the NA3 voltage and the voltage of the vertical signal line NSIG is stored in the capacitor CAP21. At Time T21, the NA3 voltage is equal to the voltage of the ramp-wave signal line NREF3. Therefore, assuming that a clamp voltage of the ramp-wave signal line NREF3 is Vclmp, the reset level of the vertical signal line NSIG is Vrst, and capacitance of the capacitor CAP21 is Cp1, charge Q3 stored in the capacitor CAP21 is given by the following Equation (33).

$$Q3 = Cp1(Vrst - Vclmp) \quad (33)$$

Furthermore, when the switch S22 is turned on, the output terminal and the input terminal of the inverter INV are short circuited, so that the NC3 voltage and an ND3 voltage reach a circuit threshold Vt1.

Then, the switching control circuit 45 turns off the switches S21 and S22 (Time T22), and the ramp-wave generation circuit 44 increases the voltage of the ramp-wave signal line NREF3 from the clamp voltage Vclmp to the reference voltage. Then, when the switching control circuit 45 turns off the switch S21, the differential amplifier AMP21 outputs a voltage corresponding to a difference between the voltage of the ramp-wave signal line NREF3 and the NA3 voltage.

When the signal conversion circuits 42 performs digital sampling of the reset level, a ramp wave signal whose voltage is to be decreased in proportion to time is output from the ramp-wave generation circuit 44 to the ramp-wave signal line NREF3 (Times T23 to T25). In this case, because the power-supply-noise adding circuit 43 is connected to the ramp-wave generation circuit 44, the voltage of the ramp-wave signal line NREF3 equals the sum of the ramp wave signal generated by the ramp-wave generation circuit 44 and power supply noise.

From Time T23 to Time T25, assuming that the voltage of the ramp wave signal generated by the ramp-wave generation circuit 44 is Vref1 and power supply noise superimposed on the ramp wave signal is ΔVn1, the voltage of the ramp-wave signal line NREF3 becomes Vref1+ΔVn1. Meanwhile, the NA3 voltage becomes Vclmp+ΔVn1 according to the law of conservation of charge.

Consequently, assuming that a gain of the differential amplifier AMP21 is A, an NB3 voltage Vnb1 output from the differential amplifier AMP21 is given by the following Equation (34), so that the power supply noise ΔVn1 at the reset level can be removed.

$$Vnb1 = A \times \{Vref1 + \Delta Vn1 - (Vclmp + \Delta Vn1)\} \quad (34)$$

The NB3 voltage Vnb1 output from the differential amplifier AMP21 is input to the counter CN via the inverter INV and the counter CN performs countdown to thereby perform the digital sampling of the reset level. When Vref1<Vclmp, the NB3 voltage Vnb1 output from the differential amplifier AMP21 is inverted (Time T24), and the countdown by the counter CN is stopped. Because the NC3 voltage and the ND3 voltage are not affected by the power supply noise, the count value by the counter CN is not affected by the power supply noise ΔVn1.

When the digital sampling of the reset level is completed, the ramp-wave generation circuit 44 increases the voltage of the ramp-wave signal line NREF3 to the reference voltage (Time T25).

Then, when a read pulse is output to the read signal line RD (Time T26), the read transistor M1 illustrated in FIG. 2 is turned on. When the read transistor M1 is turned on, a voltage corresponding to the amount of charge stored in the photodiode PD is applied to the transfer transistor M4. In this case, because the transfer transistor M4 and the current source 17 function as a source follower, when the voltage corresponding to the amount of the charge stored in the photodiode PD is applied to the gate of the transfer transistor M4, the voltage of the vertical signal line NSIG follows the applied voltage, so that the voltage of the vertical signal line NSIG is shifted to the read level (Time T27).

When the signal conversion circuits 42 performs the digital sampling of the read level, the ramp wave signal whose voltage is decreased in proportion to time is re-output from the ramp-wave generation circuit 44 to the ramp-wave signal line NREF3 (Times T28 to T30).

From Time T28 to Time T30, assuming that the voltage of the ramp wave signal generated by the ramp-wave generation circuit 44 is Vref2 and power supply noise superimposed on the ramp wave signal is ΔVn2, the voltage of the ramp-wave signal line NREF3 becomes Vref2+ΔVn2.

Meanwhile, assuming that the read level is Vrd, because the following Equation (35) is satisfied, the NA3 voltage Vna2 at this time is given by the following Equation (36).

$$Cp1 \times (Vrst - Vclmp) = Cp1 \times (Vrd + \Delta Vn2 - Vna2) \quad (35)$$

$$Vna2 = Vclmp - \{Vrst - (Vrd + \Delta Vn2)\} \quad (36)$$

Consequently, assuming that the gain of the differential amplifier AMP21 is A, an NB3 voltage Vnb2 output from the differential amplifier AMP21 is given by the following Equation (37), so that the power supply noise ΔVn2 at the read level can be removed.

$$\begin{aligned} Vnb2 &= A \times (Vref2 + \Delta Vn2 - Vna2) \\ &= A \times \{Vref2 - \{Vclmp - (Vrst - Vrd)\}\} \end{aligned} \quad (37)$$

The NB3 voltage Vnb2 output from the differential amplifier AMP21 is input to the counter CN via the inverter INV and the counter CN performs count-up to thereby perform the digital sampling of the read level. When Vref2<Vclmp−(Vrst−Vrd), the NB3 voltage Vnb2 output from the differential amplifier AMP21 is inverted (Time T29), and the count-up by the counter CN is stopped. Because the NC3 voltage and the ND3 voltage are not affected by the power supply noise, the count value by the counter CN is not affected by the power supply noise ΔVn2.

When the digital sampling of the read level is completed, the ramp-wave generation circuit 44 increases the voltage of the ramp-wave signal line NREF3 to the reference voltage (Time T30).

Consequently, it is possible to remove the power supply noise ΔVn1 and ΔVn2 superimposed on the signal component without providing the reference-voltage generation circuit 24 illustrated in FIG. 3. As a result, processing time can be shortened and image quality can be improved.

While a method of arranging the inverter INV in a subsequent stage of the differential amplifier AMP21 is described in the above-mentioned seventh embodiment, the inverter INV, the switch S22, and the capacitor CAP22 are not necessary.

Furthermore, while a method of arranging the counter CN in the signal conversion circuits 42 is described, in the above-mentioned seventh embodiment, it is possible to arrange the counter CN independent of the signal conversion circuits 42.

Eighth Embodiment

Figure 18:
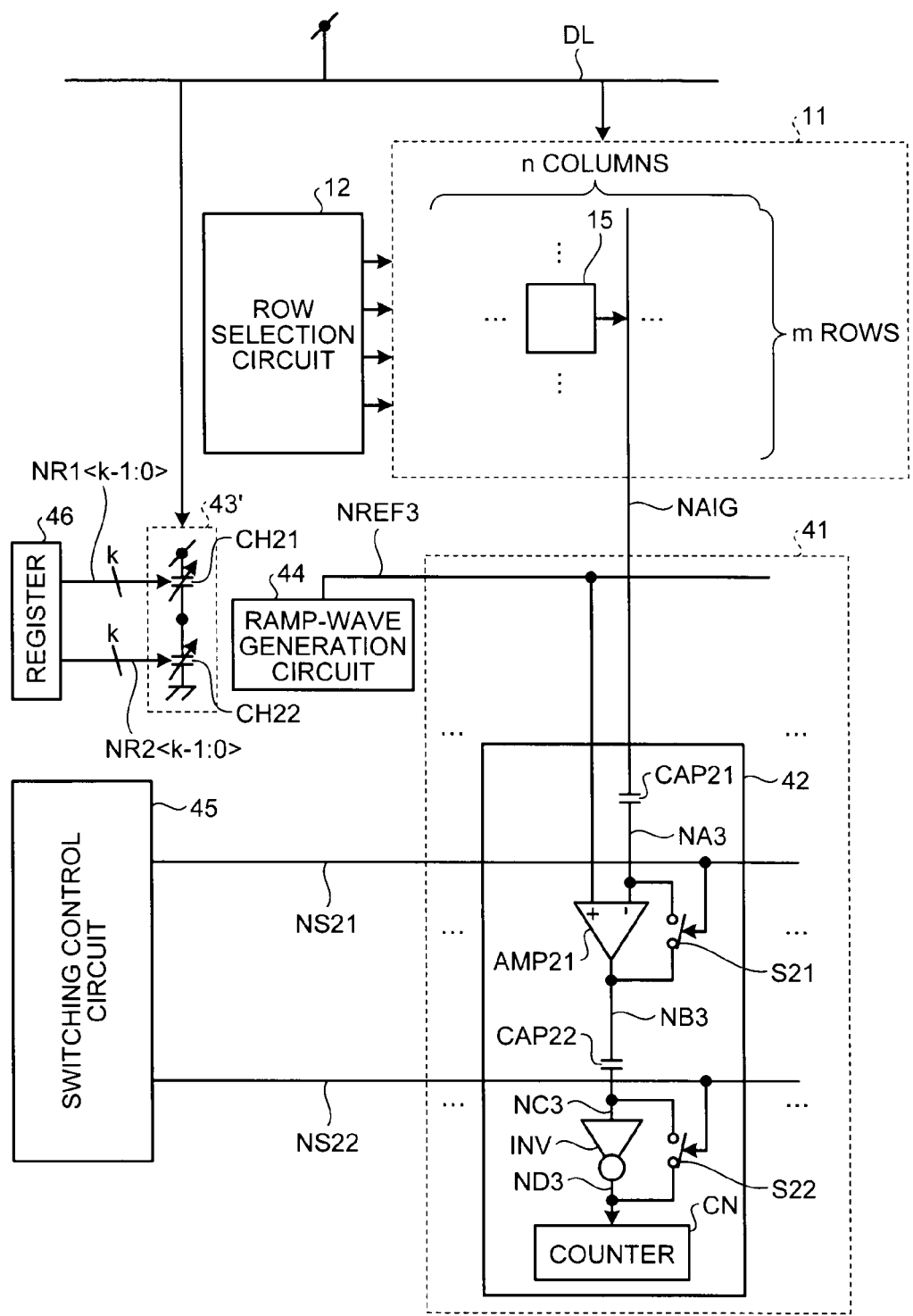
FIG. 18 is a block diagram of a general configuration of a power-supply-noise cancelling circuit applied to a signal conversion circuit according to an eighth embodiment of the present invention.

FIG. 18 is a block diagram of a general configuration of a power-supply-noise cancelling circuit applied to a signal conversion circuit according to an eighth embodiment of the present invention.

In FIG. 18, the power-supply-noise cancelling circuit includes a power-supply-noise adding circuit 43' instead of the power-supply-noise adding circuit 43 illustrated in FIG. 16, and further includes a register 46. The power-supply-noise adding circuit 43' includes variable capacitance elements CH21 and CH22. One end of the variable capacitance element CH21 is connected to the power supply and one end of the variable capacitance element CH22 is connected to the ground. The other end of the variable capacitance element CH21 and the other end of the variable capacitance element CH22 are connected to the ramp-wave generation circuit 44.

The register 46 is able to select a value of the variable capacitance element CH21 via the capacitance selection line NR1<k−1:0> and a value of the variable capacitance element CH22 via the capacitance selection line NR2<k−1:0>.

Figure 19:
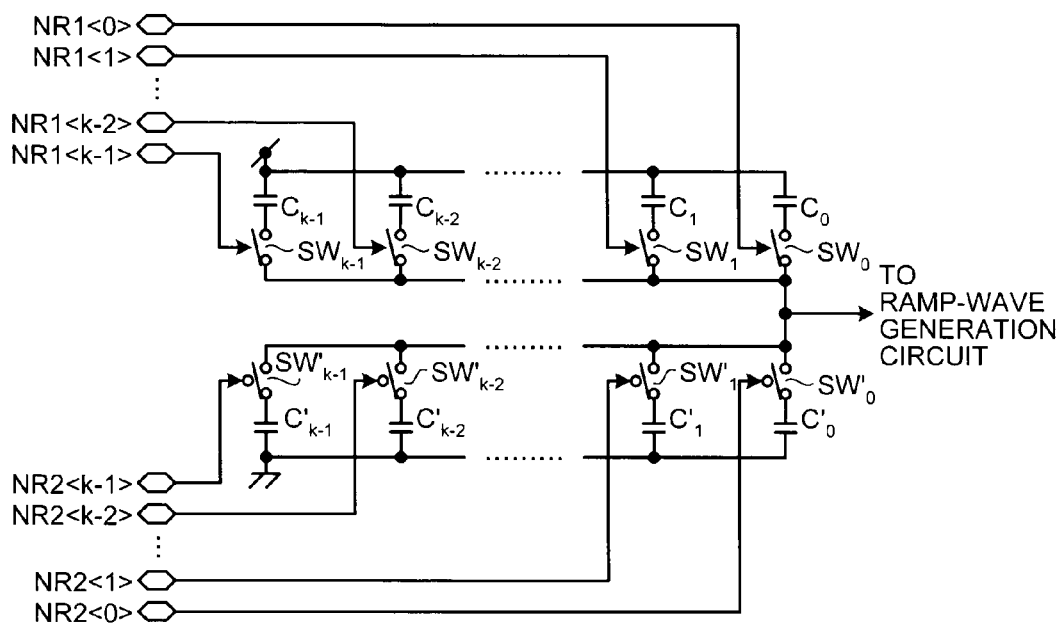
FIG. 19 is a diagram illustrating an example of a circuit configuration of a power-supply-noise adding circuit illustrated in FIG. 18.

FIG. 19 is a diagram illustrating an example of a circuit configuration of a power-supply-noise adding circuit illustrated in FIG. 18.

In FIG. 19, capacitors $C_0$ to $C_{k-1}$ are arranged in the variable capacitance element CH21 and capacitors $C_0'$ to $C_{k-1}'$ are arranged in the variable capacitance element CH22. One ends of the capacitors $C_0$ to $C_{k-1}$ are connected to the power supply, and one ends of the capacitors $C_0'$ to $C_{k-1}'$ are connected to the ground. Furthermore, the other ends of the capacitors $C_0$ to $C_{k-1}$ are connected to the ramp-wave generation circuit 44 via respective switches $SW_0$ to $SW_{k-1}$ and the other ends of capacitors $C_0'$ to $C_{k-1}'$ are connected to the ramp-wave generation circuit 44 via respective switches $SW_0'$ to $SW_{k-1}'$.

Any value from 0 to $2^{k-1}$ can be set to the register 46. Accordingly, as illustrated in FIG. 7, the switches $SW_0$ to $SW_{k-1}$ and $SW_0'$ to $SW_{k-1}'$ are turned on and off depending on the value set to the register 46 to connect the capacitors $C_0$ to $C_{k-1}$ and $C_0'$ to $C_{k-1}'$ to the ramp-wave generation circuit 44 to thereby change the capacitance added to the ramp-wave generation circuit 44. In this case, it is preferable to set the value of the register 46 so that the values of the variable capacitance elements CH21 and CH22 become equal to the values of the parasitic capacitance CF1 and CF2 illustrated in FIG. 2.

The power-supply-noise cancelling circuit illustrated in FIG. 18 is able toe operate according to the timing diagram of FIG. 17. At Time T21 of FIG. 17, assuming that the reset level of the vertical signal line NSIG is Vrt, the voltage of the ramp-wave signal line NREF3 is Vclmp, and the capacitance of the capacitor CAP21 is Cp1, charge of Cp1×(Vrst−Vclmp) are charged in the capacitor CAP21.

At Time T23, it is assumed that the voltage of the ramp wave signal is Vref1 and power supply noise is $\beta \times \Delta Vn1$, where $\beta$ is a gain of the power-supply-noise adding circuit 43'. Furthermore, assuming that the gain of the pixel 15 is $\alpha$, power supply noise output to the vertical signal line NSIG becomes $\alpha \times \Delta Vn1$.

At this time, assuming that the gain of the differential amplifier AMP21 is A, the NB3 voltage Vnb1 is given by the following Equation (38).

$$Vnb1 = A \times \{Vref1 + \beta \times \Delta Vn1 - (Vclmp + \alpha \times \Delta Vn1)\} \quad (38)$$

By adjusting the gain $\beta$ of the power-supply-noise adding circuit 43' such that $\beta = \alpha$, it is possible to remove the power supply noise $\Delta Vn1$.

Furthermore, at Time T28, assuming that Vref2 is a ramp wave voltage and $\beta \times \Delta Vn2$ is power supply noise output to the ramp-wave signal line NREF3, and Vrd is a voltage of the read level and $\alpha \times \Delta Vn2$ is power supply noise output to the vertical signal line NSIG, the NA3 voltage Vna2 is given by the following Equation (39).

$$Vnb2 = A \times \{Vref2 - \{Vclmp - (Vrst - Vrd)\}\} \quad (39)$$

By adjusting the gain $\beta$ of the power-supply-noise adding circuit 43' such that $\beta = \alpha$, it is possible to remove the power supply noise $\Delta Vn2$.

In this case, by changing the value of the register 46, the values of the variable capacitance elements CH21 and CH22 can be changed. Therefore, even when the values of the parasitic capacitance CF1 and CF2 illustrated in FIG. 2 are changed, it is possible to remove the power supply noise $\Delta Vn1$ and $\Delta Vn2$ superimposed on the signal component without providing the reference-voltage generation circuit 24 illustrated in FIG. 3.

Ninth Embodiment

Figure 20:
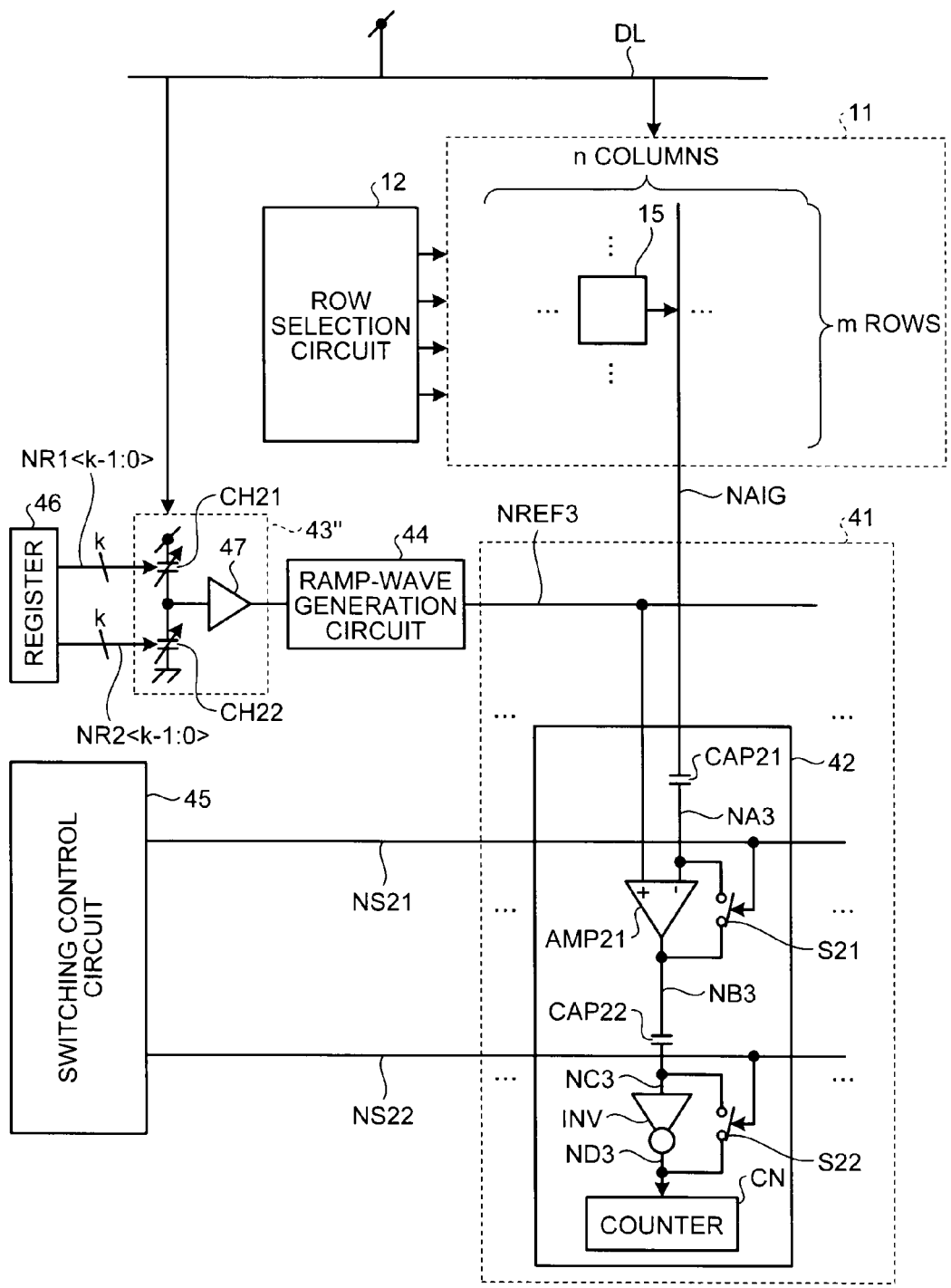
FIG. 20 is a block diagram of a general configuration of a power-supply-noise cancelling circuit applied to a signal conversion circuit according to a ninth embodiment of the present invention.

FIG. 20 is a block diagram of a general configuration of a power-supply-noise cancelling circuit applied to a signal conversion circuit according to a ninth embodiment of the present invention.

In FIG. 20, the power-supply-noise cancelling circuit includes a power-supply-noise adding circuit 43" instead of the power-supply-noise adding circuit 43' illustrated in FIG. 18. The power-supply-noise adding circuit 43" includes a buffer 47 in addition to the configuration of the power-supply-noise adding circuit 43'. The buffer 47 is disposed between the variable capacitance element CH22 and the ramp-wave generation circuit 44.

Figure 21:
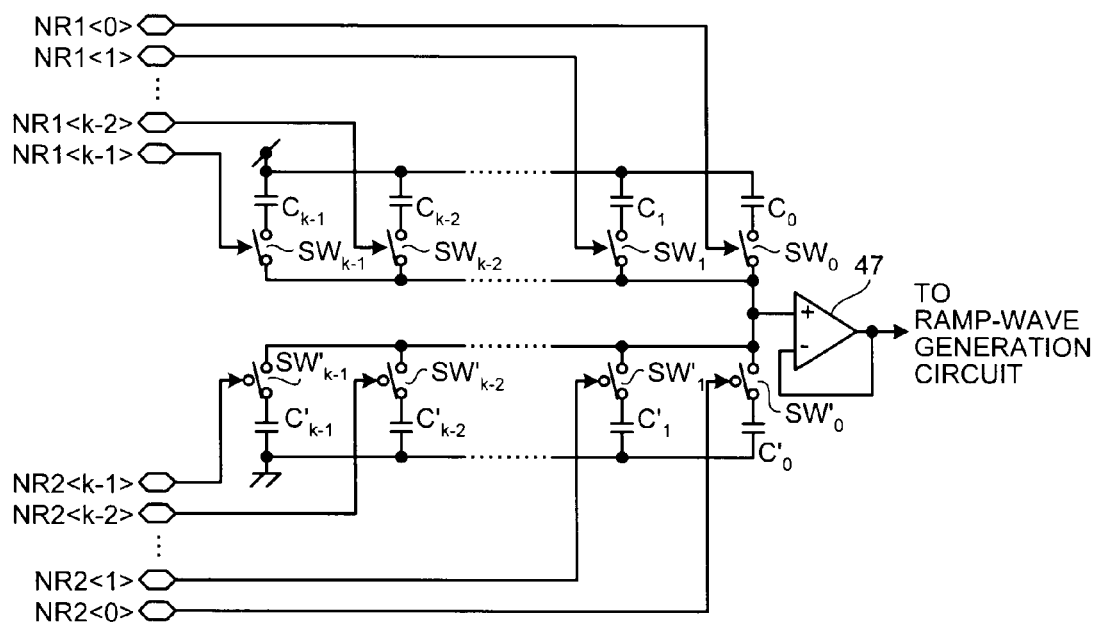
FIG. 21 is a diagram illustrating an example of a circuit configuration of a power-supply-noise adding circuit illustrated in FIG. 20.

FIG. 21 is a diagram illustrating an example of a circuit configuration of a power-supply-noise adding circuit illustrated in FIG. 20.

In FIG. 21, the power-supply-noise adding circuit 43" illustrated in FIG. 20 includes the buffer 47 in addition to the configuration of FIG. 19. The buffer 47 is disposed between the switch $SW_0'$ and the ramp-wave generation circuit 44 illustrated in FIG. 20.

The power-supply-noise cancelling circuit illustrated in FIG. 20 is able to operate according to the timing chart of FIG. 17. At Time T21, assuming that the reset level of the vertical signal line NSIG is Vrt, the voltage of the ramp-wave signal line NREF3 is Vclmp, and the capacitance of the capacitor CAP21 is Cp1, charge of Cp1×(Vrst−Vclmp) is charged to the capacitor CAP21.

At Time T23, it is assumed that a voltage of the ramp wave signal is Vref1 and power supply noise is $\beta \Delta Vn1$, where $\beta$ is a gain of the power-supply-noise adding circuit 43". Furthermore, assuming that the gain of the pixels 15 is $\alpha$, the power supply noise output to the vertical signal line NSIG becomes $\alpha \times \Delta Vn1$.

At this time, assuming that the gain of the differential amplifier AMP21 is A, the NB3 voltage Vnb1 is given by Equation (38). By adjusting the gain $\beta$ of the power-supply-noise adding circuit 43" such that $\beta = \alpha$, it is possible to remove the power supply noise $\Delta Vn1$.

Furthermore, at Time T28, assuming that Vref2 is a ramp wave voltage and $\beta \times \Delta Vn2$ is power supply noise output to the ramp-wave signal line NREF3, and Vrd is a voltage of the read level and $\alpha \times \Delta Vn2$ is power supply noise output to the vertical signal line NSIG, the NB3 voltage Vnb2 is given by Equation (40). In this case, by adjusting the gain $\beta$ of the power-supply-noise adding circuit 43" such that $\beta = \alpha$, the power supply noise $\Delta Vn2$ can be removed.

By disposing the buffer 47 between the variable capacitance element CH22 and the ramp-wave generation circuit 44, it is possible to prevent the power-supply-noise adding circuit 43" from being affected by parasitic capacitance of the ramp-wave signal line NREF3. Consequently, accuracy of the power supply noise output from the power-supply-noise adding circuit 43" can be maintained constant.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power-supply-noise cancelling circuit, comprising:
   a reference-voltage generation circuit that generates a reference voltage;
   a power-supply-noise adding circuit that adds power supply noise superimposed on a power supply to the reference voltage; and
   a differential amplifier that amplifies a difference between a read signal read out from each pixel of an imaging element and a reference voltage to which power supply noise at the time of reading the read signal is added;
   wherein the power-supply-noise adding circuit includes
   a plurality of capacitors connected in parallel to one of a power supply line and a ground line, and
   a switch for selecting, from among the plurality of capacitors, a capacitor to be connected to an amplifier reference voltage line to transfer a reference voltage.

2. The power-supply-noise cancelling circuit according to claim 1, further comprising a buffer disposed between the switch and the differential amplifier.

3. The power-supply-noise cancelling circuit according to claim 1, further comprising a register for storing a value to be used for turning on and off the switch.

4. A power-supply-noise cancelling circuit comprising:
   a reference-voltage generation circuit that generates a reference voltage;

a power-supply-noise adding circuit that adds power supply noise superimposed on a power supply to the reference voltage;

a capacitor that stores therein a difference between a first sampling signal, which is read out from each pixel of an imaging element and sampled at a first sampling time, and a reference voltage to which power supply noise at the time of the first sampling is added; and a differential amplifier that amplifies a difference between a value obtained by subtracting a signal stored in the capacitor from a second sampling signal, the second sampling signal being read out from each pixel of the imaging device and sampled at a second sampling time, and a reference voltage to which power supply noise at the second sampling time is added.

5. The power-supply-noise cancelling circuit according to claim 4, further comprising a ramp-wave generation circuit that superimposes a ramp-wave signal on a signal read out from each pixel of the imaging element.

6. The power-supply-noise cancelling circuit according to claim 4, wherein the power-supply-noise adding circuit is a variable capacitance element connected to the power supply.

7. The power-supply-noise cancelling circuit according to claim 6, wherein a value of the variable capacitance element is set to be equal to a value of parasitic capacitance between the pixel and one of a power supply line and a ground line.

8. The power-supply-noise cancelling circuit according to claim 4, wherein the power-supply-noise adding circuit includes
a plurality of capacitors connected in parallel to one of a power supply line and a ground line, and
a switch for selecting, from among the plurality of capacitors, a capacitor to be connected to an amplifier reference voltage line to transfer a reference voltage.

9. The power-supply-noise cancelling circuit according to claim 8, further comprising a buffer disposed between the switch and the differential amplifier.

10. The power-supply-noise cancelling circuit according to claim 8, further comprising a register for storing a value to be used for turning on and off the switch.

11. A solid-state imaging device comprising:
a pixel array in which pixels are arrayed in a matrix form;
a vertical signal line for transferring a signal read out from the pixels in a vertical direction;
a power line for supplying a power supply to the pixels;
a reference voltage generation circuit that generates a reference voltage and outputs the reference voltage to an amplifier reference voltage line;
a power-supply-noise adding circuit that outputs power supply noise superimposed on the power line to the amplifier reference voltage line; and
a differential amplifier that amplifies a difference between a read signal read out from each pixel of the pixel array and a reference voltage to which power supply noise at the time of reading the read signal is added.

12. The solid-state imaging device according to claim 11, further comprising:
a ramp-wave generation circuit that outputs a ramp-wave signal to a ramp-wave signal line;
a first capacitor that stores therein charge corresponding to a differential voltage between a clamp voltage obtained from the ramp-wave signal line and a voltage of a read level of the pixels; and
a second capacitor that stores therein charge corresponding to a differential voltage between a voltage obtained by adding the power supply noise to the reference voltage and a voltage of a reset level of the pixels, wherein
upon completion of sampling of the read level, the ramp-wave generation circuit temporarily reduces potential of the ramp-wave signal line and then increases the potential of the ramp-wave signal line at a constant rate, and subsequently counts clock from time when the potential of the ramp-wave signal line becomes equal to the clamp voltage to time when a voltage of a terminal of the second capacitor becomes equal to a voltage of the amplifier reference voltage line to thereby convert the signal read out from the pixels into digital data.

13. The solid-state imaging device according to claim 12, further comprising:
a first switch connected between the vertical signal line and one end of the first capacitor, and also connected between the vertical signal line and one end of the second capacitor;
a second switch connected between other end of the first capacitor and the ramp-wave signal line;
a third switch connected between an output terminal of the differential amplifier and an inverting input terminal of the differential amplifier, and also connected between the output terminal of the differential amplifier and other end of the second capacitor;
a fourth switch connected between an output terminal of the power-supply-noise adding circuit and the amplifier reference voltage line; and
a switching control circuit that controls ON/OFF of the first switch, the second switch, the third switch, and the fourth switch.

14. The solid-state imaging device according to claim 13, wherein
when performing sampling of the reset level, the switching control circuit turns on the first switch, the third switch, and the fourth switch, and then turns off the third switch, and
when performing sampling of the read level, the switching control circuit keeps turning on the second switch and turns off the first switch and the fourth switch.

* * * * *